United States Patent [19]
Matsushiro

[11] Patent Number: 5,694,126
[45] Date of Patent: Dec. 2, 1997

[54] ADAPTIVE PREDICTIVE DATA COMPRESSION METHOD AND APPARATUS

[75] Inventor: Nobuhito Matsushiro, Tokyo, Japan

[73] Assignee: Oki Data Corporation, Tokyo, Japan

[21] Appl. No.: 617,453

[22] Filed: Mar. 18, 1996

[30] Foreign Application Priority Data

| Mar. 20, 1995 | [JP] | Japan | 7-060904 |
|---|---|---|---|
| May 31, 1995 | [JP] | Japan | 7-133292 |

[51] Int. Cl.$^6$ .................................................. H03M 7/30
[52] U.S. Cl. ........................ 341/50; 341/51; 341/63; 341/86; 341/87; 341/102; 341/107
[58] Field of Search ............................ 341/50, 51, 52, 341/53, 63, 86, 87, 102, 106, 107

[56] References Cited

U.S. PATENT DOCUMENTS

| 3,908,181 | 9/1975 | Shigaki et al. | 340/347 |
|---|---|---|---|
| 4,580,129 | 4/1986 | Bahgat | 340/347 |
| 4,811,112 | 3/1989 | Rutledge | 358/260 |
| 4,939,749 | 7/1990 | Zurcher | 375/30 |
| 5,107,519 | 4/1992 | Ishikawa | 375/27 |
| 5,136,396 | 8/1992 | Kato et al. | 358/426 |
| 5,331,426 | 7/1994 | Kato et al. | 358/426 |
| 5,533,051 | 7/1996 | James | 375/240 |
| 5,541,594 | 7/1996 | Huang et al. | 341/51 |
| 5,550,540 | 8/1996 | Furlan et al. | 341/51 |

FOREIGN PATENT DOCUMENTS

| 230518 | 8/1992 | Japan . |
|---|---|---|
| 250775 | 9/1992 | Japan . |
| 67978 | 3/1993 | Japan . |
| 328136 | 12/1993 | Japan . |

OTHER PUBLICATIONS

Y. Yasuda and S. Kato, "Still Image Coding and Its Applications", *The Journal of the Institute of Electronics, Information, and Communication Engineers*, vol. 71, No. 7, pp. 669–675, Jul., 1968.

H. Yasuda, *International Standards for Multimedia Coding*, pp. 48–65, pp. 67–81, Maruzen, Jun. 1991.

N. Matsuhiro and O. Asasda, "Highly Efficient Arithmetic Coding for Bi–Level Images", *The Journal of the Institute of Television Engineers of Japan*, vol. 49, No. 1, Jan. 1995.

*Primary Examiner*—Jeffrey A. Gaffin
*Assistant Examiner*—Jason H. Vick
*Attorney, Agent, or Firm*—Panitch Schwarze Jacobs & Nadel, P.C.

[57] ABSTRACT

An input data sequence is divided into fixed-length source segments, and each source segment is predicted from preceding data. The data are coded as a sequence of coded segments, each designating a non-negative number of correctly predicted segments and a non-negative number of literal segments. The literal segments are inserted into the coded data among the coded segments. The coded data are decoded by decoding each coded segment, predicting the designated number of correctly predicted segments from previously decoded data, and copying the literal segments. The length of the coded segments may vary according to the number of consecutive correctly predicted segments. The prediction rule, or the original data, may be modified under certain conditions, in order to increase the predictability of the source segments.

60 Claims, 29 Drawing Sheets

ADAPTIVE PREDICTIVE DATA COMPRESSION METHOD AND APPARATUS

BACKGROUND OF THE INVENTION

The present invention relates to methods of compressively coding data and decoding the compressed data.

The prior art abounds in methods of data compression for various purposes. One purpose served by the present invention is that of compressing bit-mapped image data for transmission between a computer and a peripheral device such as a page printer. The invented methods and apparatus are also of potential utility in such areas as transmission of data between a computer and a scanner, facsimile transmission, and transmission of data over computer networks.

One object of the invention is to provide satisfactory coding performance for continuous-tone image data than have been converted to bilevel data by the process known as dithering. Such images will be referred to below as dithered images.

A page printer has a fixed maximum printing rate, typically expressed in pages per minute, so it suffices to transmit data quickly enough for the maximum printing rate to be achieved. When the data comprise character codes, this presents no problem, but when bit-mapped image data are transmitted, the amount of data is on the order of one or more megabytes per page. Transmission of such quantities of data in uncompressed form can be too time-consuming to satisfy the demands of the printer's maximum printing rate.

The data must accordingly be compressed by coding in the computer, and decompressed by decoding In the printer. For bilevel data comprising black and white dots, two known methods of compression are run-length coding and arithmetic coding.

Run-length coding, which is used in facsimile transmission, encodes the length of consecutive runs of black dots or white dots. There are many versions of this method, including two-dimensional versions. Run-length coding works well for certain types of bit-mapped images, such as line drawings and bit-mapped text, but fails badly for dithered images. Run-length coding typically increases the volume of dithered image data.

Arithmetic coding succeeds in compressing typical dithered image data by a factor of about two or three, but the arithmetic coding and decoding processes themselves are time-consuming. An arithmetic coder calculates a probability that each dot will be black or white, on the basis of a set of nearby reference dots. Not only are the probability calculations complex, but the need to refer to a different set of reference dots for each dot in the image creates a heavy memory-access burden. When arithmetic coding is used for transmission of data to a page printer, the printer's page-per-minute performance tends to be limited, not by data volume and data transmission speed, but by the speed of the arithmetic coder and decoder.

Similar problems occur when run-length coding and arithmetic coding are applied to continuous-tone images with multiple gray levels, or to color images.

SUMMARY OF THE INVENTION

It is accordingly an object of the present invention to provide a method of compressing data that is efficient in terms of compression ratio divided by coding time.

Another object of the invention is to provide a method of compressing data that is efficient in terms of compression ratio divided by decoding time.

Yet another object is to reduce the size of the coder and decoder.

The invented coding method comprises the steps of:

dividing an input sequence of symbols into source segments of n consecutive symbols each, where n is a fixed integer greater than one;

deriving a predicted value for each source segment from symbols preceding the source segment in certain positions;

determining whether each source segment is correctly or incorrectly predicted; and outputting a sequence of coded segments, each coded segment designating a first non-negative number of correctly predicted source segments and a second non-negative number of incorrectly predicted source segments. Each coded segment is followed by literal segments identical to the incorrectly predicted source segments, if any.

The coded segments may have variable length. The length then increases after a certain number of consecutive coded segments all designating zero literal segments, and decreases after a certain number of consecutive coded segments all designating one or more literal segments.

The invented decoding method comprises the steps of:

decoding each coded segment to obtain the above-described first and second non-negative numbers;

predicting from previously decoded data a number of segments equal to the first non-negative number; and copying a number of literal segments equal to the second non-negative number directly from the coded data.

The invented coder and decoder have a coding or decoding model circuit comprising a predictor for making the necessary predictions, and preferably a pattern rule controller for altering internal data in the predictor when the predictor has made a certain number of incorrect predictions from the same input data.

The predictor may consist of a look-up table stored in a random-access memory. The look-up table may be divided into two or more parts, which independently predict corresponding parts of each segment.

If the coded segments have variable length, the model circuit also comprises a length controller for controlling the length of the coded segments.

The coding model circuit may also have a modification controller that, under certain conditions, alters the data to be coded so that predictions which were slightly incorrect become correct.

The invented coding and decoding methods can be applied to images consisting of pixels, each pixel represented by a certain number of symbols. When one pixel is represented by two or more symbols, these two or more symbols are disposed consecutively In the input sequence of symbols.

DETAILED DESCRIPTION OF THE INVENTION

Embodiments of the invention will now be described with reference to the attached illustrative drawings.

Figure 1:
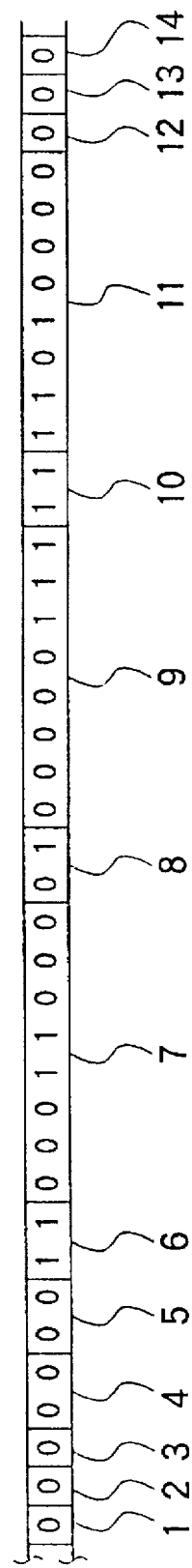
FIG. 1 illustrates a bit stream coded by a first embodiment of the invention.

Although the data to be coded and decoded may represent an image, the coder and decoder do not "know" this; as far as they are concerned, the data are just sequences of symbols. In the embodiments the symbols will be '0' and '1,' and "bit" will be used as a synonym for "symbol." The invention is not restricted to bit symbols, however; the embodiments can be modified for use with symbols other than binary bits First embodiment FIG. 1 shows a bit (symbol) stream coded according to a first embodiment of the invention. The bit stream consists of a sequence of coded segments, with literal segments interspersed among the coded segments. The coded segments have variable length; the literal segments have a fixed length of eight bits.

The invention is not limited to eight-bit literal segments. In general, the literal segment length is n bits or symbols, where n can be any integer greater than one.

Each coded segment can be decoded to yield a pair of non-negative integers indicating how to obtain the desired decoded data. The first integer A designates a number of decoded segments that can be obtained by prediction from preceding decoded data. These decoded segments have the same length as the literal segments. The second integer B designates a number of decoded segments that must be copied from the literal segments in the coded bit stream. In the first embodiment the second integer B is always zero or one.

The coded segments in the first embodiment are decoded as follows. If the length of a coded segment is K bits, and the value of the coded segment, treated as an unsigned binary integer, is J, then:

$$A = 2^K - 1 - J$$

$$B = 0 \text{ if } J = 0$$

$$B = 1 \text{ if } J > 0$$

TABLE 1

| Coded segment | Bit length K | No. of predicted segments A | No. of literal segments B |
|---|---|---|---|
| 0 | 1 | 1 | 0 |
| 1 | 1 | 0 | 1 |
| 00 | 2 | 3 | 0 |
| 01 | 2 | 2 | 1 |
| 10 | 2 | 1 | 1 |
| 11 | 2 | 0 | 1 |

This coding rule is well suited for certain hardware implementations of the coder and decoder of the first embodiment, but the invention is not limited to this rule. Any coding rule that yields two non-negative integers A and B in the appropriate ranges may be used.

The length of the coded segments in the first embodiment is determined as follows. Initially, the length is one bit (K=1). Each time a certain number M of coded segments designating zero literal segments (B=0) occur consecutively, the length K of the coded segments is increased by one bit. Each time M coded segments designating one literal segment (B=1) occur consecutively (interspersed with the literal segments), the length K is decreased by one bit. M is a fixed positive integer.

The value of M in FIG. 1 is three. Coded segment 1 indicates that one decoded segment (eight bits) is to be obtained by prediction from preceding decoded data (not visible). Coded segments 2 and 3 indicate the same. At this point three coded segments indicating zero literal segments have occurred successively, so the length of the coded segments increases from one to two bits.

Coded segments 4 and 5 each indicate that three decoded segments are to be obtained by prediction. Coded segment 6 indicates that no decoded segments are to be obtained by prediction, but one segment is to copied literally from the coded bit stream. This literal segment 7 follows coded segment 6.

The next coded segment 8 designates that two segments are to be predicted, then one segment copied from the following literal segment 9. Coded segment 10 indicates that literal segment 11 is to be copied. At this point three non-zero coded segments, designating one literal segment each, have occurred in succession, so the length of the coded segments decreases from two bits to one bit. The next three coded segments 12, 13, and 14 each indicate that one segment is to be obtained by prediction.

Figure 2:
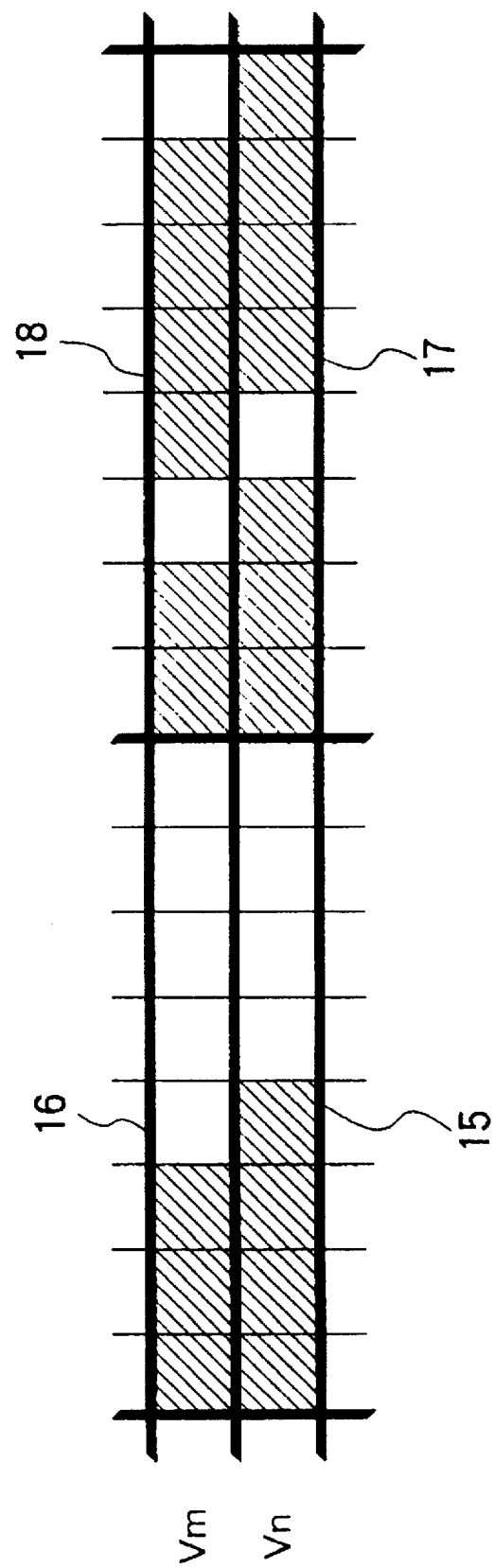
FIG. 2 illustrates an image prediction process according to the invention.

A segment is predicted from m bits in certain relative positions preceding the segment, where m is a fixed integer greater than one. If the decoded data represent a bit-mapped image, then m can be equal to the segment length n, for example, and the relative positions can be such that a segment is predicted from the segment immediately above it in the image. In FIG. 2, segment 15 is predicted from segment 16, and segment 17 from segment 18.

The invention is not limited to this prediction scheme, even for image data. For example, a segment could be predicted from the segment above and the single bit to the left (in which case m=n+1). Normally m should not be less than n, but even this is not a restriction.

Figure 3:
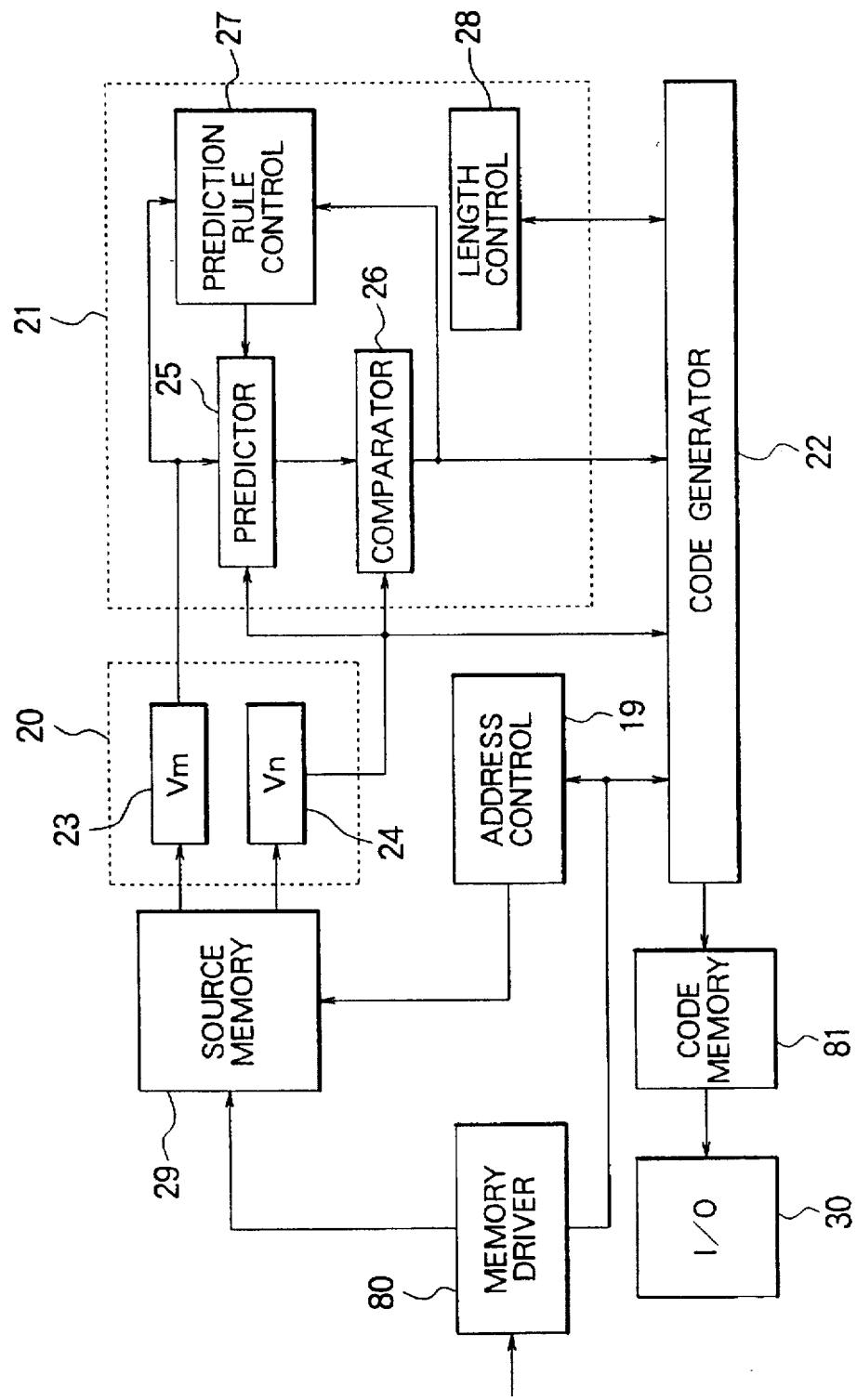
FIG. 3 is a block diagram of a first novel coder.

FIG. 3 shows the coder employed in the first embodiment. The coder comprises an address controller 19, a buffer unit 20, a coding model circuit 21, and a code generator 22, which are interconnected as shown. The buffer unit 20 comprises two registers 23 and 24. The coding model circuit 21 comprises a predictor 25, a comparator 26, a prediction rule controller 27, and a length controller 28.

The data to be coded are stored in a source memory unit 29 by a memory driver 80. The memory driver 80 also provides header information to the address controller 19 and code generator 22. Data stored at addresses designated by the address controller 19 in the source memory unit 29 are input to the buffer unit 20. Coded data produced by the code generator 22 are stored temporarily in a code memory 81, then sent to an input-output (I/O) unit 30. The I/O unit 30 may be, for example, a data storage unit, a communication channel, an input-output port of a computing device, or any other type of I/O facility.

The term "register" as used herein means a memory unit in which data are temporarily stored while being processed. In the coder in FIG. 3, register 24 is an n-bit memory unit storing the segment Vn currently being coded, and register 23 is an m-bit memory unit storing an m-bit value Vm from which Vn is predicted.

Figure 4:
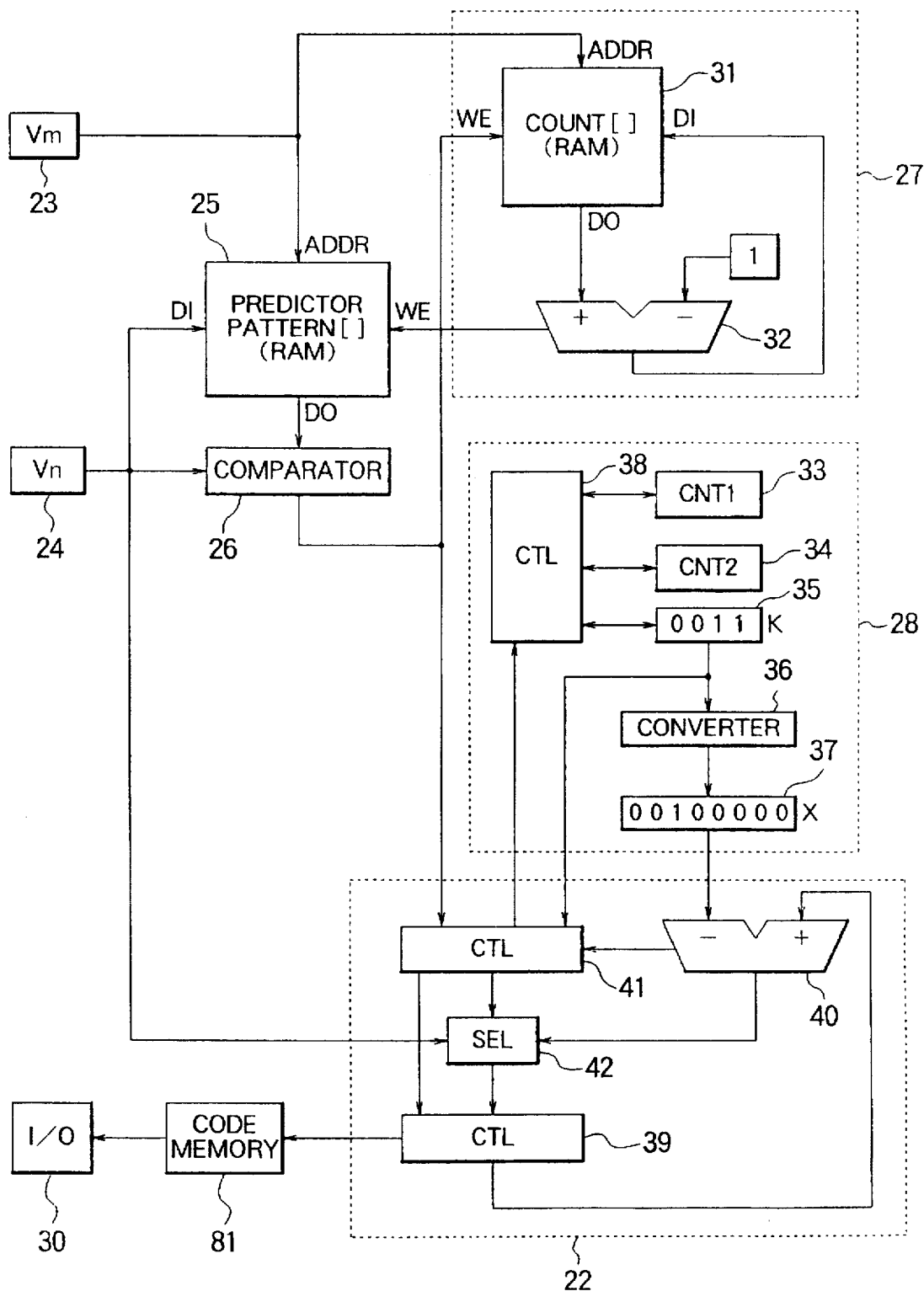
FIG. 4 is a more detailed block diagram of the code generator and associated parts of the first novel coder.

FIG. 4 shows the detailed structure of the code generator 22, prediction rule controller 27, and length controller 28, and identifies the signals sent and received by the predictor 25.

The prediction rule controller 27 comprises a random-access memory (RAM) 31 and a subtractor 32.

The random-access memory 31 stores an array named COUNT in the form of a look-up table. The random-access memory 31 receives Vm as an address signal, receives a write enable (WE) signal from the comparator 26, and receives input data (DI) from the subtractor 32. When the write enable signal WE is inactive, the random-access memory 31 outputs a count value stored at the address indicated by Vm as output data (DO). The output data will also be denoted COUNT[Vm]. When WE is active, the random-access memory 31 stores the input data DI at the indicated address (Vm), thus updating the count value stored at that address.

The subtractor 32 subtracts a fixed value of one from the output DO of the random-access memory 31, and supplies the resulting value as input DI to the random-access memory 31.

The predictor 25 is another random-access memory addressed by Vm, and operates like random-access memory 31. The predictor 25 stores an array named PATTERN as a look-up table, receives Vn from register 24 as input data DI, receives a write enable signal WE from the subtractor 32, and provides output data DO to the comparator 26. The output data will also be denoted PATTERN[Vm].

The length controller 28 comprises registers 33 and 34 storing first and second count values CNT1 and CNT2, a register 35 storing the value K described earlier, a K–X converter 36 for converting K to a value X, a register 37 for storing X, and a control unit 38 for incrementing and decrementing the values in registers 33, 34, and 35.

The code generator 22 comprises a register 39 storing data W to be sent to the code memory 81, a subtractor 40 that subtracts X from W, a control unit 41, and a selector 42. The control unit 41 receives the output of the comparator 26, the value of K held in register 35, and a zero-flag signal from the subtractor 40 indicating whether W−X=0, and controls register 39 and the selector 42. The selector 42 selects either the value Vn output by register 24 or the difference W−X output by the subtractor 40, and stores the selected value in register 39.

Circuit details of control units 38 and 41 will be omitted. These units can be implemented as finite-state machines, or in various other ways well known in the digital electronics art.

The comparator 26 comprises, for example, a subtractor for subtracting Vn from PATTERN[Vm] and generating a signal indicating whether the result is zero. Alternatively, the comparator 26 comprises a set of n exclusive-OR gates coupled in parallel to an n-input OR gate or NOR gate.

Figure 5:
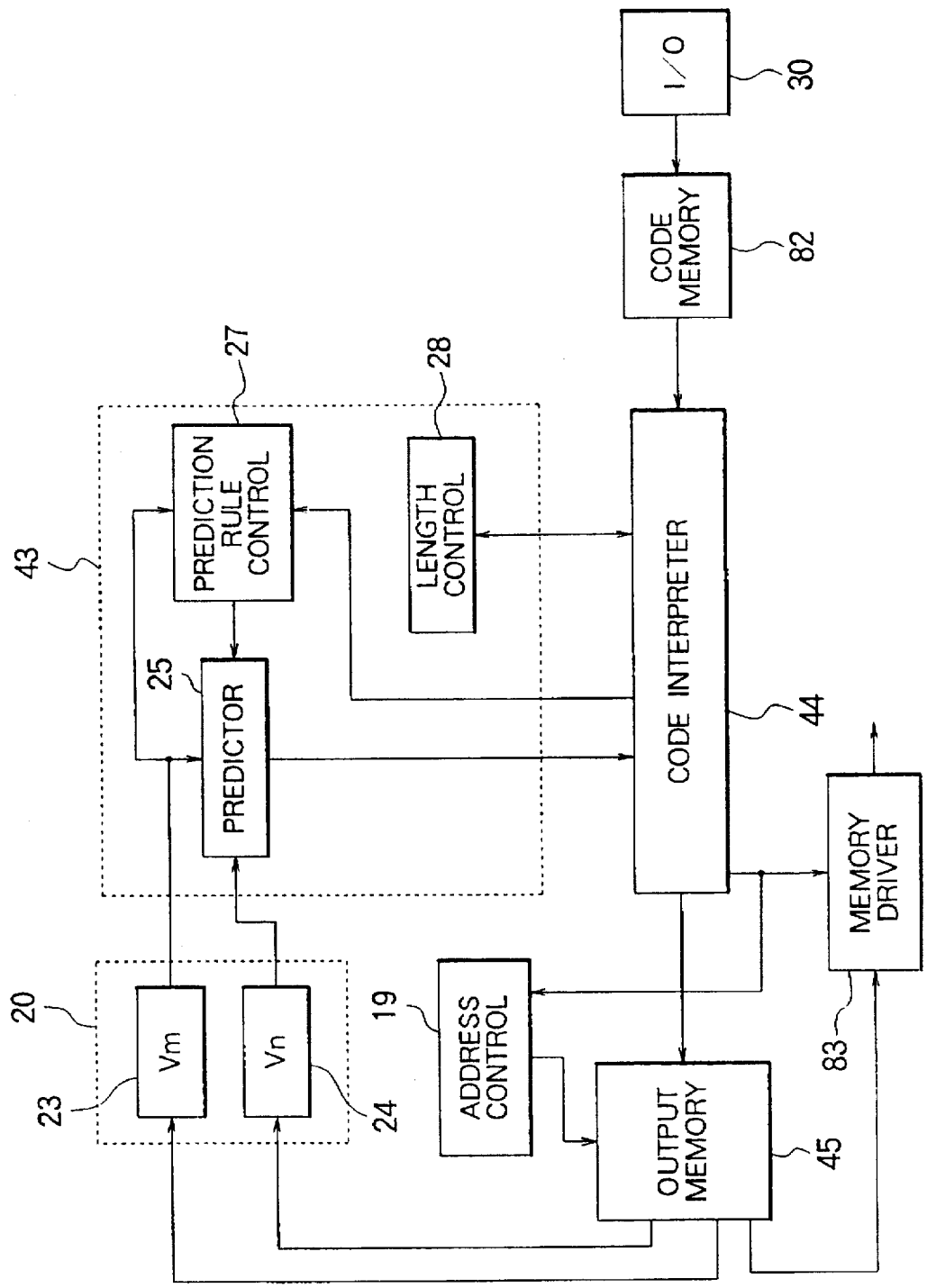
FIG. 5 is a block diagram of a first novel decoder.

FIG. 5 shows the decoder employed in the first embodiment, using the same reference numerals as in FIG. 3 to denote identical or equivalent elements. The decoder comprises an address controller 19, a buffer unit 20, a decoding model circuit 43, and a code interpreter 44. The code interpreter 44 receives a coded data sequence, produced by the coder in FIG. 3, from the I/O unit 30 via a code memory 82, and stores a decoded data sequence in an output memory unit 45. The address controller 19 designates addresses in the output memory unit 45 in substantially the same way that the address controller 19 in the coder designates addresses in the source memory unit 29. The decoded data are read from the output memory unit 45 by a memory driver 83, which adds header information received from the code interpreter 44. The code memory 82 acts as a buffer between the code interpreter 44 and I/O unit 30.

The buffer unit 20 in the coder is structurally identically to the buffer unit 20 in the coder, comprising registers 23 and 24, which receive data from the output memory unit 45. The decoding model circuit 43 comprises a predictor 25, prediction rule controller 27, and length controller 28, which are identical to the corresponding elements in the coder, but has no comparator.

Figure 6:
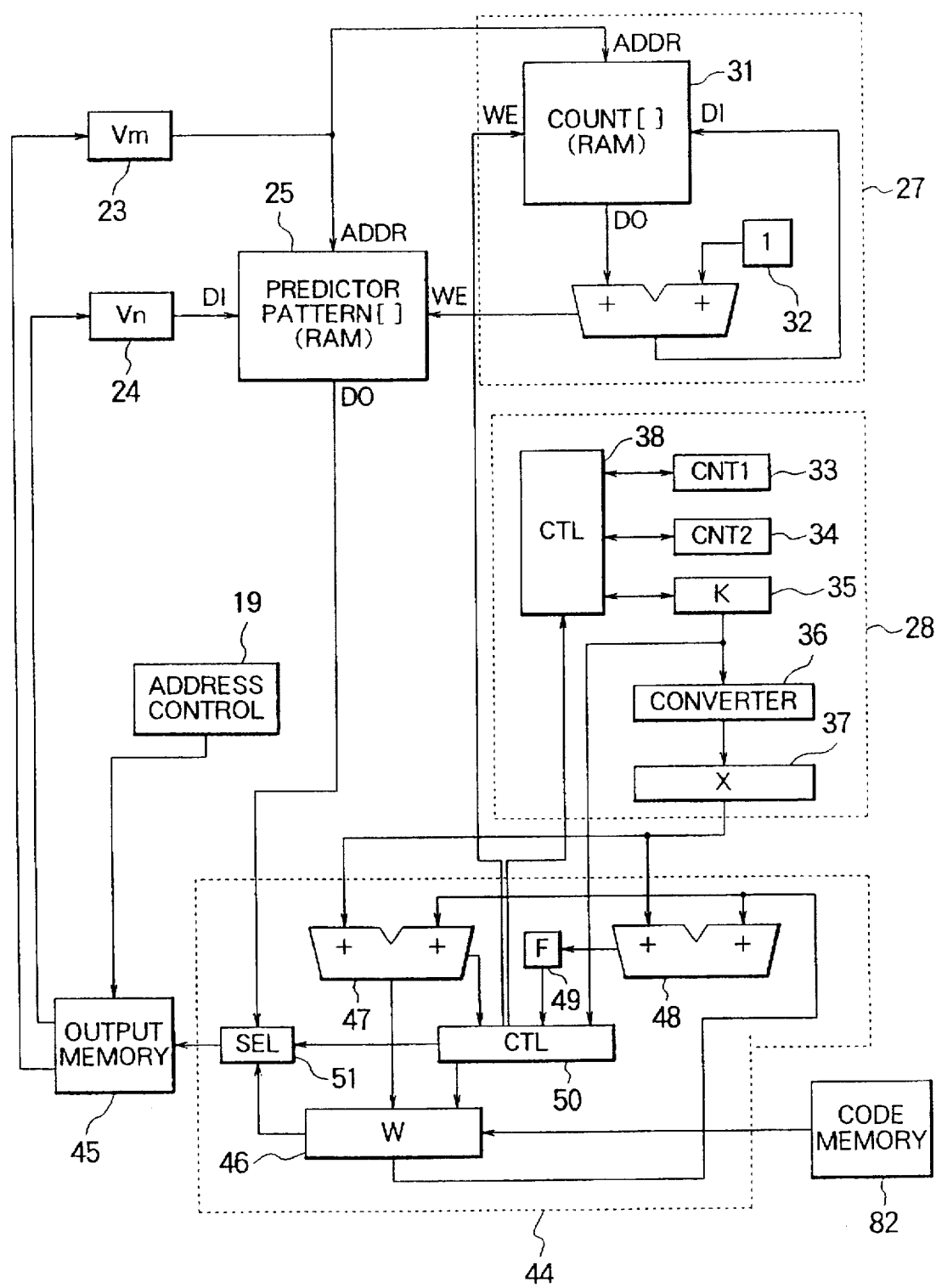
FIG. 6 is a more detailed block diagram of the code interpreter and associated parts of the first novel decoder.

FIG. 6 shows the detailed structure of the code interpreter 44 and its interconnections to the predictor 25, prediction rule controller 27, and length controller 28. The same reference numerals are used as in FIG. 4 for the internal parts of the prediction rule controller 27 and length controller 28.

The code interpreter 44 comprises a register 46 for storing data W obtained from the code memory 82, an adder 47 for adding to W the value X obtained from register 37 in the length controller 28, a subtractor 48 for subtracting X from W, a flag register 49 for storing a borrow flag output by the subtractor 48, a control unit 50, and a selector 51. The control unit 50 receives the contents of registers 35 and 49, receives a carry signal from the adder 47, outputs a write enable (WE) signal to the random-access memory 31 in the prediction rule controller 27, and outputs other control signals to register 46, selector 51, and the control unit 38 in the length controller 28. The selector 51 selects either the n-bit predicted value output by the predictor 25 or the leftmost n bits in register 46, and stores the selected value in the output memory unit 45.

The register 37 that stores the value of X has a certain length, which will be denoted MAXK. Register 35, which stores the value of K, need only be long enough to store values from one to MAXK. If MAXK is eight, for example, then register 35 need only be four bits long (three bits long if the special rule that '000' means eight is adopted).

The K–X converter 36 decodes K to a MAXK-bit value having a one in the K-th position from the left and zeros in all the other positions. In FIG. 4, for example, MAXK is eight and K is three (binary '0011'), so the decoded X value is '00100000.'

The registers 39 and 46 that store the data W in the coder and decoder must have a bit length at least equal to the larger of n and MAXK.

Register 39 in the coder in FIG. 4 is coupled to the code memory 81 in such a way that an arbitrary number of leftmost bits in the register 39 can be moved into the code memory 81. These bits are replaced in register 39 by zeros.

Register 46 in the decoder in FIG. 6 is coupled to the code memory 82 so that an arbitrary number of bits can be moved from the code memory 82 into the rightmost positions in register 46, and is coupled to selector 51 so that the n leftmost bits in register 46 can be moved into the output memory unit 45.

Next the operation of the first embodiment will be described, with reference to the preceding drawings and to the flowcharts in FIGS. 7 to 15.

First the operation of the memory drivers 80 and 83 will be described.

In general, the data to be coded and decoded are preceded by a header containing information about the data. For image data, one item of header information is the pixel depth: the number of bits (number of symbols) representing each pixel or dot in the image. In FIG. 2 the pixel depth was one bit, but in continuous-tone images or color images the pixel depth is greater than one bit.

In general the header information cannot be predicted in the same way as the following data, so the memory driver 80 does not store the header in the source memory unit 29, but sends the header information, or at least part of the header information, directly to the code generator 22, to be output without alteration to the code memory 81, before the output of any coded data. The memory driver 80 also sends necessary header information, such as the above-mentioned pixel depth, to the address controller 19 in the coder.

In the decoder, the code interpreter 44 extracts the header from the beginning of the incoming coded data stream and supplies the header directly to the memory driver 83, bypassing the output memory unit 45. The memory driver 83 outputs the header in advance of the decoded data read from the output memory unit 45. The code interpreter 44 also supplies necessary header information, such as the above-mentioned pixel depth, to the address controller 19 in the decoder.

In addition to header information, the coder and decoder may receive other information, such as, in the case of image data, the pixel width and height of the image. The address controllers 19 in the coder and decoder generate addresses on the basis of all this information. For example, from the width (number of pixels) of an image and the depth (number of bits) of each pixel, the address controllers 19 can calculate the location of the segment above each source segment or decoded segment. The address controllers 19 can also locate the end of each horizontal line in the image, and if necessary, take special action to ensure that each horizontal line starts at the beginning of a segment.

When the data to be coded are image data with a pixel depth greater than one, the memory driver 80 stores the data in pixel order. For example, if the pixel depth is four bits and the first four pixels have values of one (binary '0001'), four ('0100'), six ('0110'), and fifteen ('1111'), then the first sixteen bits stored by the memory driver 80, forming two eight-bit segments in the source memory unit 29, are the following:

---
0001 0100 0110 1111
---

The bits representing each pixel in the image are thus disposed consecutively in the input data. The memory driver 80 does not divide the data into bit planes. The value of n should therefore be equal to, or evenly divisible by, the pixel depth.

The values of m and n are preset in the coder and decoder.

Next the coding and decoding processes will be described.

Figure 7:
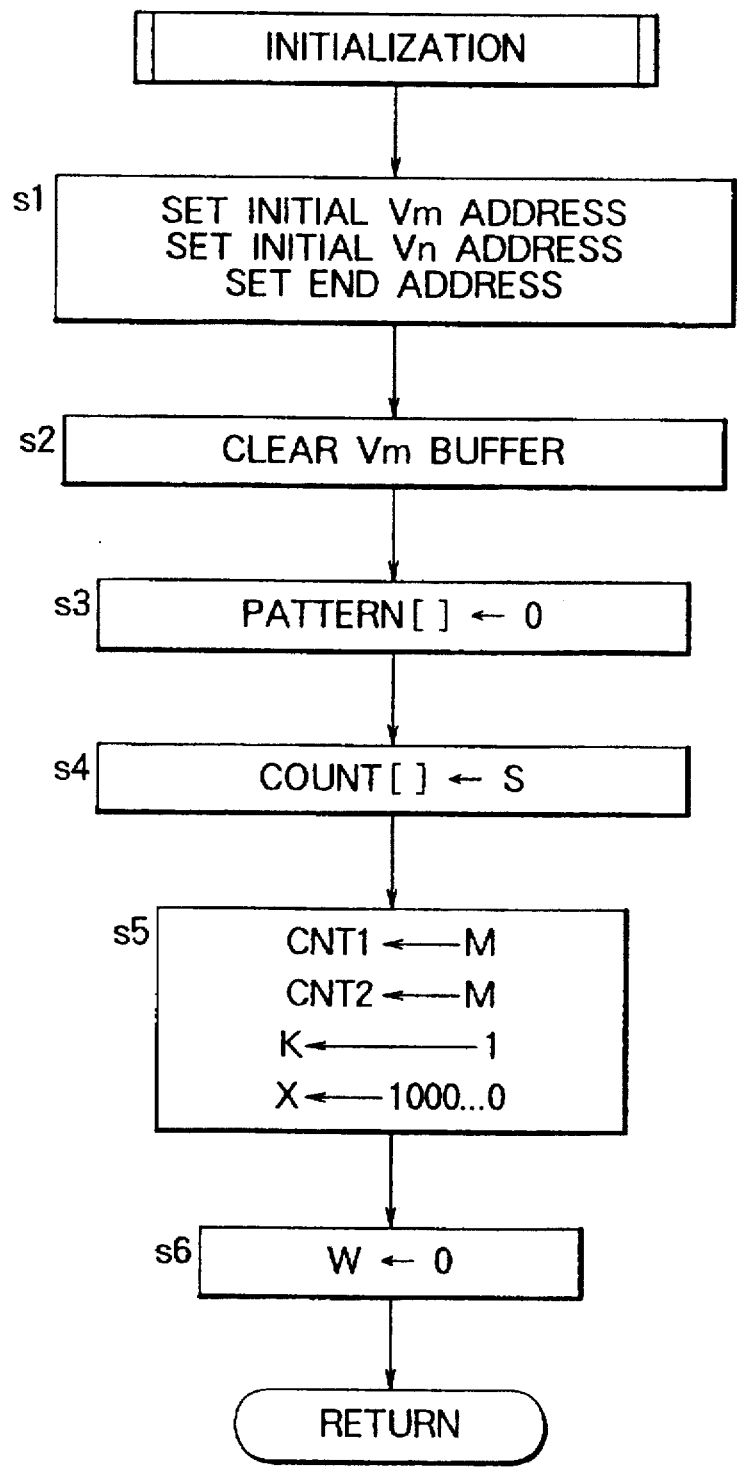
FIG. 7 is a flowchart of an initialization process in the first embodiment.

FIG. 7 shows an initialization process common to the coder and decoder in the first embodiment.

Step s1 in this initialization process initializes the address controller 19 by setting initial Vm and Vn addresses and an end address. The Vn address is the address of the first n-bit segment of data to be coded, or the first segment of decoded data. The end address is the first address after the end of the data.

The Vm address designates the position of the m bits from which the n-bit segment at the Vn address is predicted. In an image with a width of D segments, if each segment is predicted from the segment above, then in general the Vm address is equal to the Vn address minus D, and the Vm address is initialized to this value, despite the absence of image bits at this initial Vm address. If m is not equal to n, the Vm address may actually be a plurality of addresses which collectively designate the positions of all m bits in Vm.

Step s2 clears register 23 in the buffer unit 20, so that the initial value of Vm is zero.

Step s3 clears the predictor 25, so that all initial n-bit values in the PATTERN array are zero.

Step s4 sets all initial values in the COUNT array in the random-access memory 31 in the prediction rule controller 27 to a fixed integer S, which controls the speed at which the prediction rule controller 27 updates the predictor 25.

Step s5 initializes the length controller 28 by setting both count values CNT1 and CNT2 to the integer M mentioned above, and setting K to one. M may be any fixed integer. Setting K to one automatically initializes X to the binary value '1000 . . . 0'(a one bit followed by all zero bits).

Step s6 initializes the code generator 22 or code interpreter 44 by clearing the value of W to zero in register 39 or 46.

Figure 8:
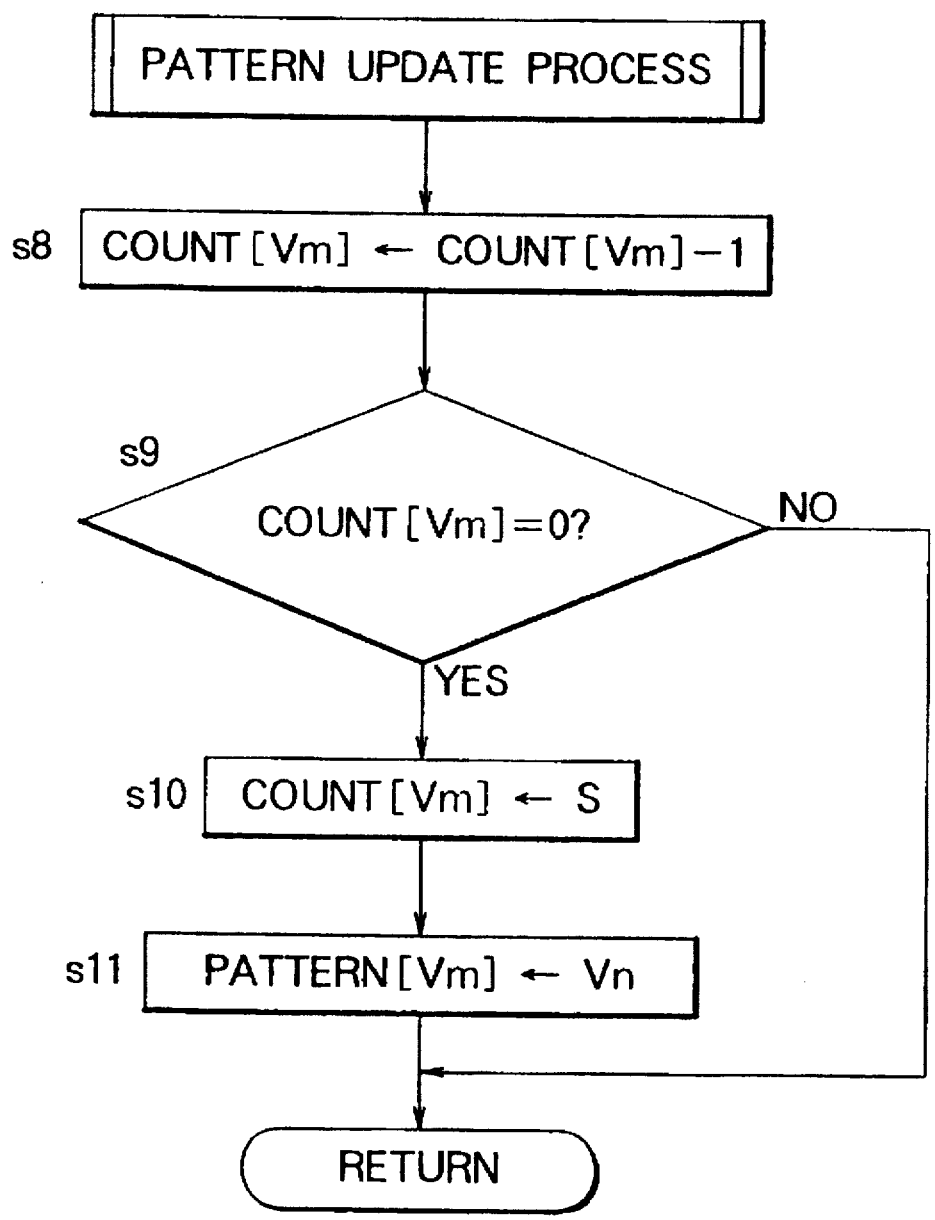
FIG. 8 is a flowchart of a prediction rule control process.

FIG. 8 illustrates a prediction rule control process or pattern update process carried out by the prediction rule controller 27 in both the coder and decoder.

In step s8, the prediction rule controller 27 receives Vm as an address value and decrements the COUNT[Vm] value stored at this address. Referring again to FIG. 4, in this step the write enable signal WE is first inactive, then active. When WE is inactive, the random-access memory 31 outputs COUNT[Vm], and the subtractor 32 calculates and outputs COUNT[Vm]–1. When WE becomes active, COUNT[Vm]–1 is stored at address Vm in the random-access memory 31, thereby updating the value of COUNT[Vm].

Referring again to FIG. 8, step s9 determines whether the decremented value of COUNT[Vm] is zero. The subtractor 32 outputs a signal, indicating whether the operation COUNT[Vm]−1 resulted in zero or not, as a write enable signal to the predictor 25. If the result was not zero, this write enable signal is inactive and no further update processing is performed.

If the COUNT[Vm] was decremented to zero, in step s10 COUNT[Vm] is reinitialized to S, by a circuit not explicitly shown in FIGS. 4 and 6. Then in step s11, since the write enable signal received by the predictor 25 is active, the value PATTERN[Vm] stored in the predictor 25 at address Vm is replaced with the Vn value received from register 24.

Incidentally, it is convenient if S is zero, in which case step s10 can be skipped. The rate at which the predictor 25 is updated is then determined by the bit length of the count values stored in the random-access memory 31. If these count values consist of two bits each, for example, then COUNT[Vm] will cycle as follows,

'00'→'11'→'10'→'01'→'00'→'11'→ . . .

and PATTERN[Vm] will be updated each time COUNT [Vm] is decremented to '00,' as if S were equal to four. The invention is not limited to any particular value of S, however.

Figure 9:
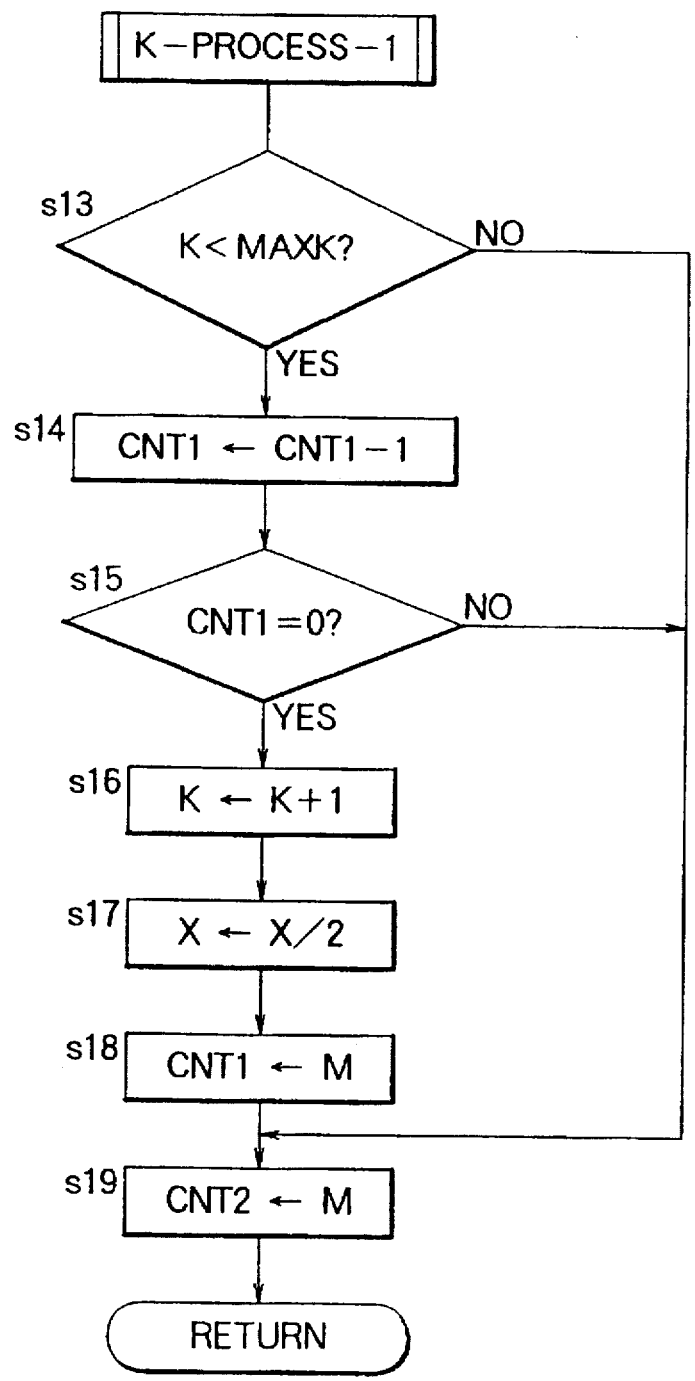
FIG. 9 is a flowchart of a process that controls the length of a coded segment in the coded bit stream.

FIG. 9 illustrates a first process, named K-process-1, carried out by the length controller 28. This process increases the length K of the coded segments, provided the length is currently less than MAXK bits.

Step s13 is a decision step carried out by control unit 38 to determine whether K is less than MAXK. If not (if K=MAXK), the succeeding steps s14 to s18 are skipped.

In steps s14 and s15, control unit 38 decrements CNT1 by one and determines whether the result is zero. If it is not (if CNT1 >0), the succeeding steps s16 to s18 are skipped.

In step s16, control unit 38 increments the value of K stored in register 3S. The K-X converter 36 converts the result, thereby moving the '1' bit stored in register 37 one position to the right. This is equivalent to dividing X by two, as indicated in step s17. In step s18, control unit 38 reinitializes CNT1 to M.

In the final step s19, control unit 38 reinitializes CNT2 to M.

Figure 10:
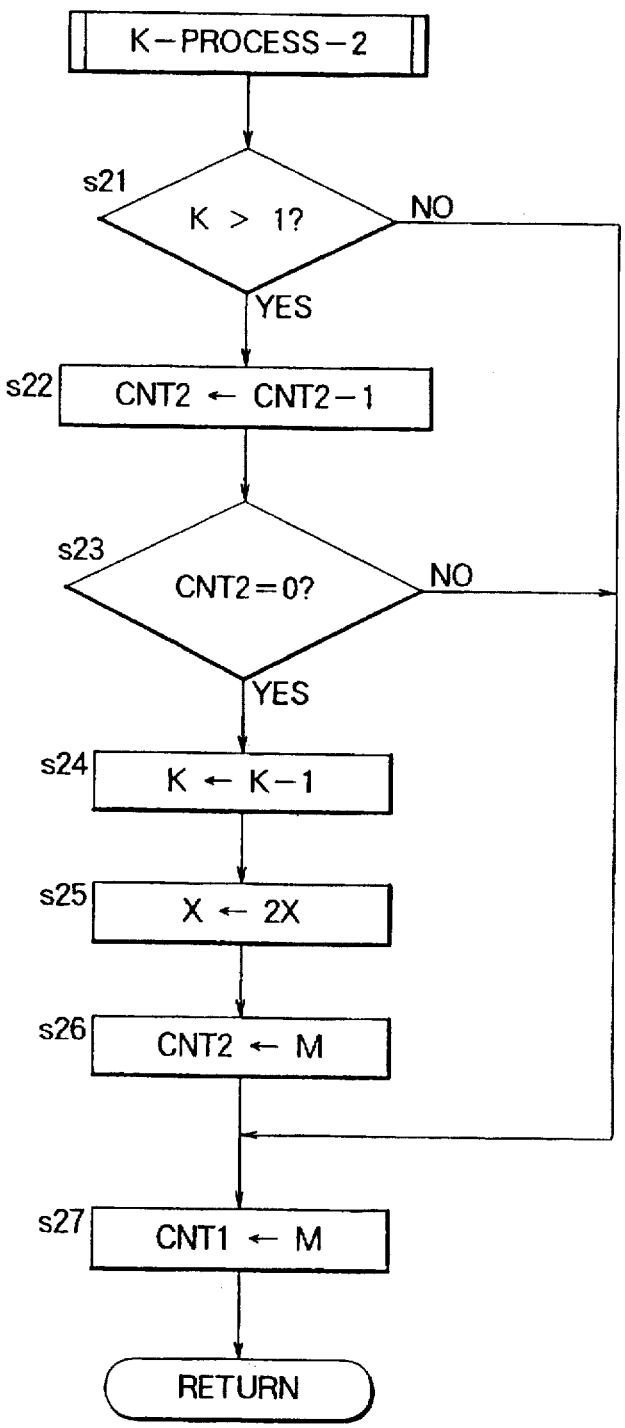
FIG. 10 is a flowchart of another process that controls the length of a coded segment in the coded bit stream.

FIG. 10 illustrates a second process, named K-process-2, carried out by the length controller 28. This process decreases the length K of the coded segments, provided the length is currently greater than one bit.

In step s21, control unit 38 decides whether K is greater than one, and skips the succeeding steps s22 to s26 if K is equal to one.

In steps s22 and s23, control unit 38 decrements CNT2, determines whether the result is zero, and skips the succeeding steps s24 to s26 if the result is not zero.

In step s24, control unit 38 decrements K, thereby moving the '1' bit stored in register 37 one position to the left. This is equivalent to multiplying X by two, as indicated in step s25. In step s26, control unit 38 reinitializes CNT2 to M.

In the final step s27, control unit 38 reinitializes CNT1 to M.

Figure 11:
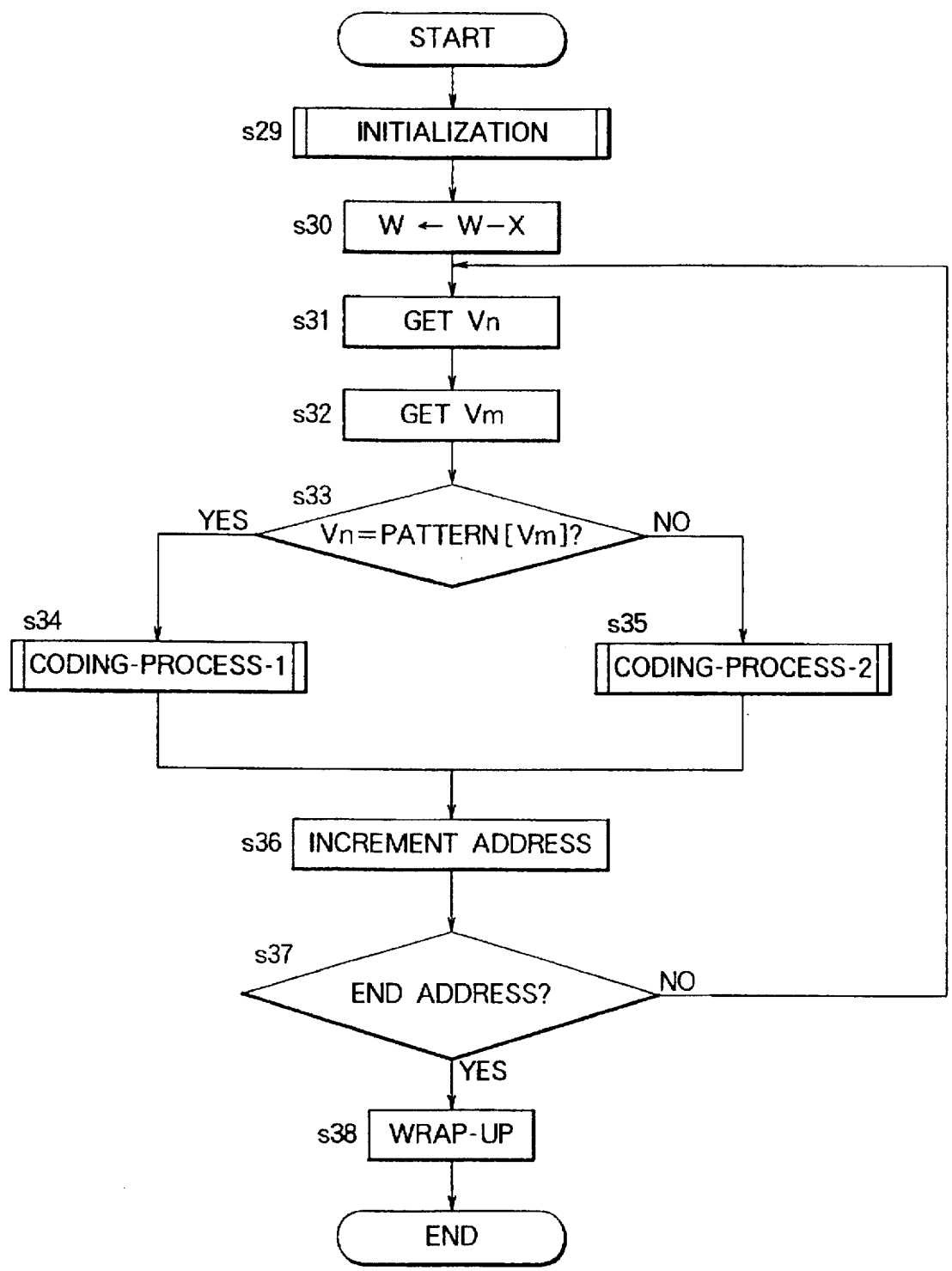
FIG. 11 is a flowchart of the coding process executed by the first novel coder.

FIG. 11 is a general flowchart of the coding process carried out by the coder in the first embodiment. This process will be described with reference to FIG. 11 and the preceding drawings.

Step s29 is the initialization process shown in FIG. 7.

In step s30, the subtractor 40 subtracts X from W, and control unit 41 controls selector 42 so that the result W−X is placed in register 39, updating the value of W. Since W is initially zero and X is initially 1000...0, this step makes W equal to X.

$$\begin{array}{r}0000\ldots0\\ -1000\ldots0\\ \hline 1000\ldots0\end{array}$$

The following steps s31 to s37 form a loop that is repeated once for each n-bit segment stored in the source memory unit 29.

In step s31, the address controller 19 sends the Vn address to the source memory unit 29, and the value Vn of the source segment at this address is stored in register 24.

In step s32, the address controller 19 sends the Vm address to the source memory unit 29, and the value Vm of the m bits at this address is stored in register 23. For the first source segment or source segments, e.g. the top line in a bit-mapped image, step s32 is skipped because there is no Vm value to get; Vm is left at its initial value of zero.

In step s33, the Vm value stored in register 23 is supplied as an address value to the predictor 25. The comparator 26 compares the value PATTERN[Vm] output by the predictor 25 with the value Vn stored in register 24, and determines whether they are equal. A first coding process named coding-process-1 is executed in step s34 if Vn and PATTERN[Vm] are equal, that is, if Vn is correctly predicted by PATTERN [Vm]. A second coding process named coding-process-2 is executed In step s35 if Vn and PATTERN[Vm] are not equal, that is, if Vn is incorrectly predicted.

Following either step s34 or s35, in the next step s36 the address controller 19 increments the Vn and Vm addresses so that they indicate the next n-bit source segment and corresponding m reference bits.

In the next step s37, the address controller 19 decides whether the incremented Vn address is equal to the end address. If it is not, the coder returns to step s31 to code the next n-bit source segment Vn.

When the end address is reached, the coder proceeds from step s37 to a wrap-up step s38 in which a final coded segment is output, if necessary. This final coded segment always has the value zero. If no source segments have been predicted since the preceding coded segment was output, this final zero coded segment can be omitted. The wrap-up step may also include output of a final string of dummy bits to bring the total number of coded bits to, for example, a multiple of eight, or some other necessary value.

Figure 12:
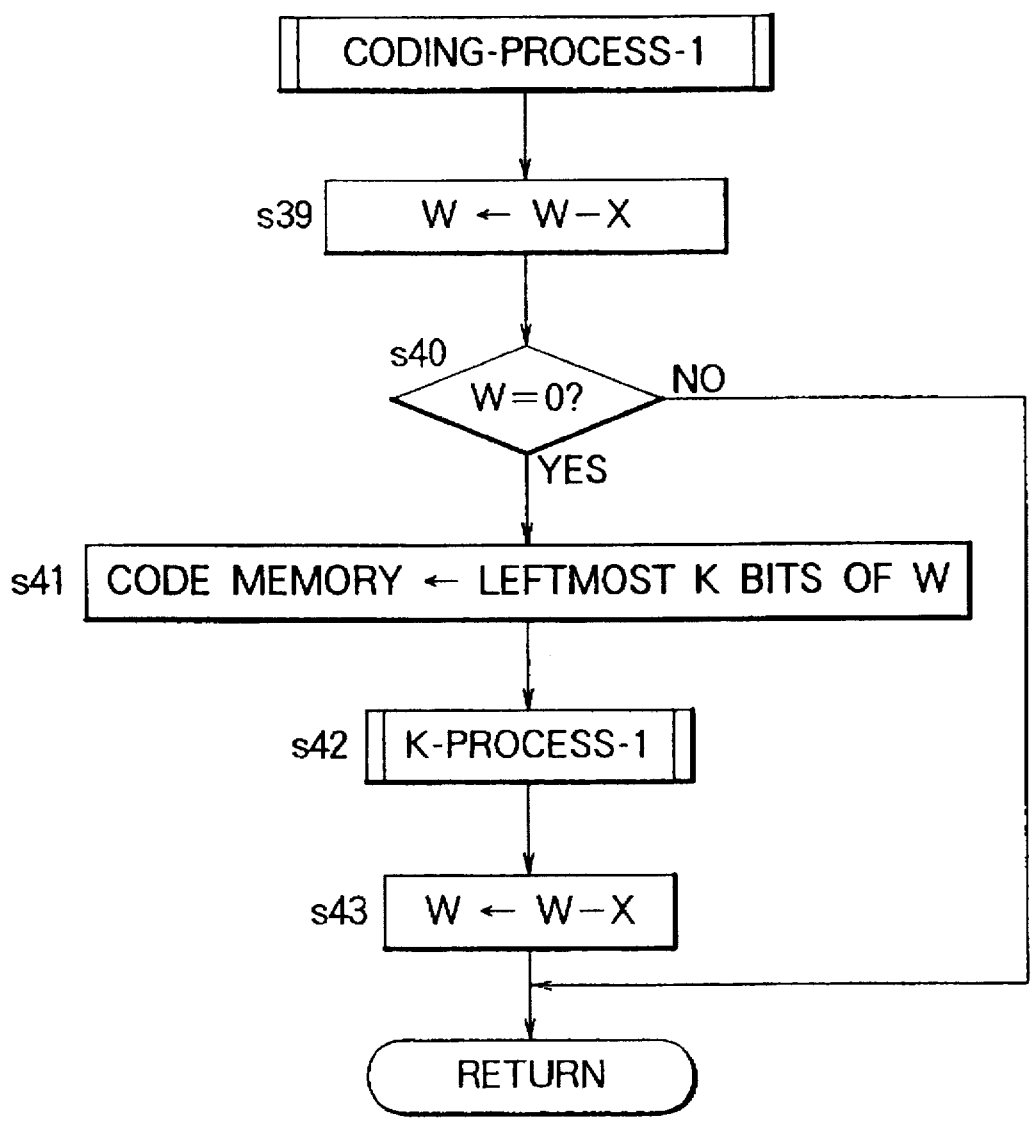
FIG. 12 is a more detailed flowchart of part of the process in FIG. 11.

FIG. 12 shows coding-process-1, which is executed each time a segment is predicted correctly.

In step s39, subtractor 40 subtracts X from W. Control unit 41 controls selector 42 so that the result is stored in register 39, updating the value of W. If W has a greater bit length than X, these operations are performed on the leftmost bits of W (the leftmost MAXK bits).

In step s40, from the zero-flag signal output by the subtractor 40, the control unit 41 decides whether W is now equal to zero. If W is not zero, the succeeding steps s41 to s43 are skipped.

If W is zero, in step s41 the code generator 22 sends the zero data in the leftmost K of bits register 39 to the code memory 81 as a coded segment, indicating that $2^K-1$ consecutive segments have been correctly predicted. This data transfer is controlled by control unit 41, which sends the necessary signals to register 39.

In step s42, control unit 41 instructs control unit 38 to carry out K-process-1. This process may alter the values of K and X, as indicated in FIG. 9. Specifically, if $2^K-1$ segments have been correctly predicted M times consecutively, resulting in the output of M consecutive coded segments with values of zero, K is incremented and X is divided by two, unless K is already equal to MAXK.

In step s43 X is again subtracted from W, which is equal to zero. The resulting value of W consists of K bits with '1' values, followed by all zero bits. For example, if K is two, then X is '0100...0', and step s43 becomes:

```
  0000...0
 -0100...0
 ─────────
  1100...0
```

To continue with this illustration, if the next n-bit source segment is correctly predicted, giving an affirmative result in step s33 in FIG. 12, then coding-process-1 will be executed again. This time, the subtraction process in step s39 will yield:

```
  1100...0
 -0100...0
 ─────────
  1000...0
```

Since the result is not zero, steps s40 to s43 will be skipped this time.

If the next two n-bit source segments are both predicted correctly, X will be subtracted from W two more times, bringing the value of W to zero. Steps s40 to s43 will then be carried out, sending a '00' coded segment to the code memory 81 and resetting W to either 1100...0 (if K is still two) or 1110...0 (if K has been incremented to three). The '00' coded segment indicates that three consecutive source segments were predicted correctly (as shown in Table 1).

Figure 13:
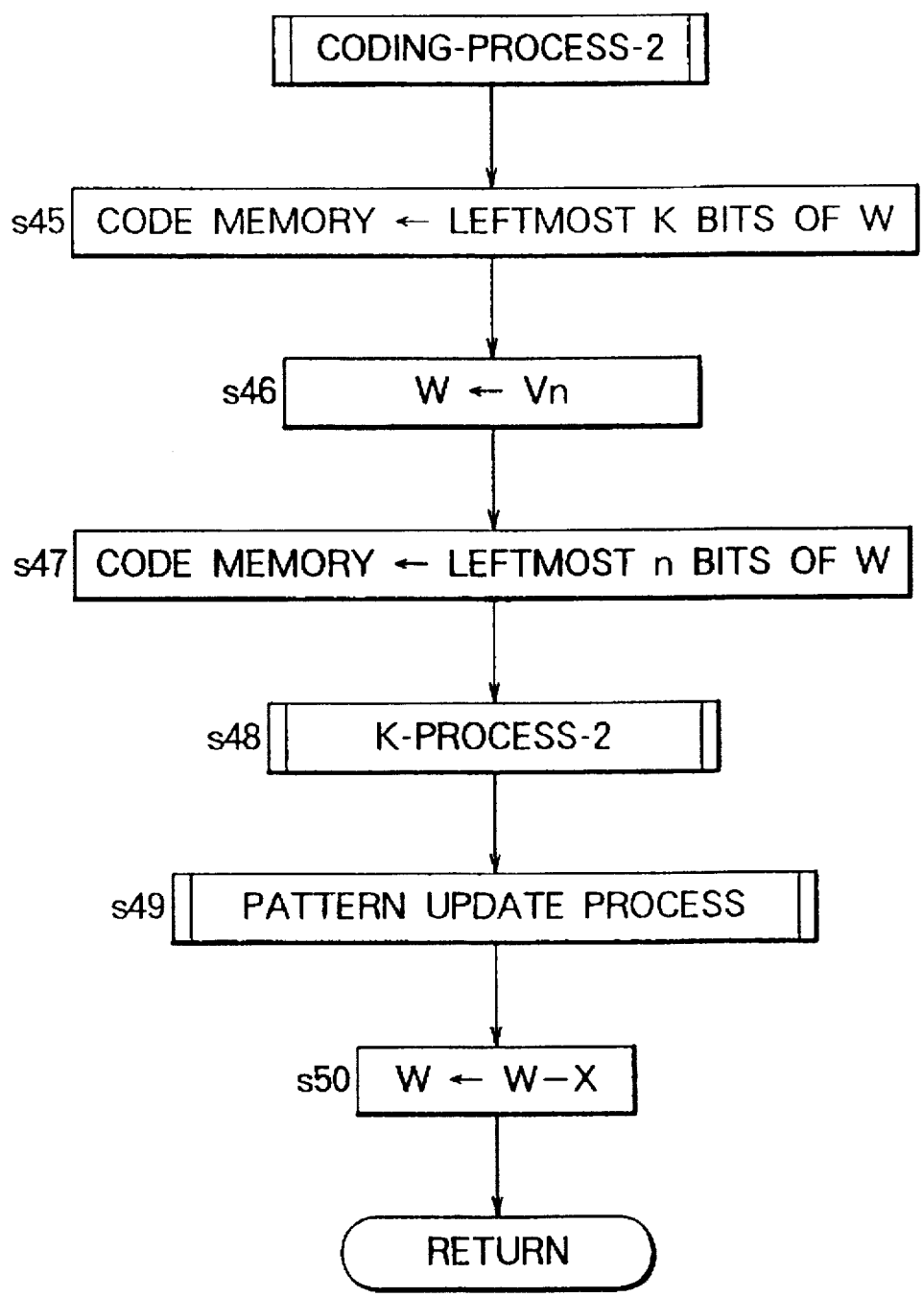
FIG. 13 is a more detailed flowchart of another part of the process in FIG. 11.

FIG. 13 shows coding-process-2, which is executed each time a source segment Vn is predicted incorrectly.

In step s45, the code generator 22 moves the leftmost K bits of W from register 39 to the code memory 81, thereby outputting a K-bit coded segment. This step leaves the value zero in register 39 (W becomes zero).

For example, if K is two and W is currently '1100...0,' then the output coded segment is '11.' By Table 1, this indicates that no source segments have been predicted correctly and one source segment has been predicted incorrectly since the last coded segment was output. This describes coded segment 6 in FIG. 1.

As another example, if K is two and W is currently '0100...0,' the output coded segment is '01' which, by Table 1, indicates two correctly predicted source segments and one incorrectly predicted source segment. This describes coded segment 8 in FIG. 1.

In any case, in step s46 control unit 41 sets selector 42 so that the incorrectly predicted source segment Vn is loaded into the leftmost n bits of register 39, and in step s47 Vn is transferred from these leftmost n bits to the code memory 81. A literal segment is thereby output, e.g. literal segment 7 or 9 in FIG. 1. This step also leaves the value zero in register 39 (W again becomes zero).

In step s48, control unit 41 instructs control unit 38 to carry out K-process-2. This process may alter the values of K and X, as indicated in FIG. 10. Specifically, if M consecutive non-zero coded segments have been output (each followed by a literal segment), K is decremented and X is multiplied by two, unless K is already equal to one.

In step s49, the pattern update process is carried out. This process is executed in response to a signal from the comparator 26 indicating an incorrect prediction, and is independent of the other steps in coding-process-2; it may be carried out at any point during coding-process-2.

This process updates PATTERN[Vm] when PATTERN [Vm], the value stored at address Vm in the predictor 25, is an incorrect prediction for the S-th time. These S incorrect predictions need not be consecutive; correct predictions from the same Vm may also have occurred in the interim. PATTERN[Vm] is updated to Vn, the current segment that was incorrectly predicted. If S is zero, the update is made at the $2^T$-th incorrect prediction, where T is the bit length of COUNT[Vm].

In step s50, X is subtracted from the value of W, which is now zero. As a result W is initialized to K '1' bits followed by all zero bits, as in step s48 of coding-process-1.

After the output of each coded segment, at the end of either coding-process-1 or coding-process-2, the leftmost K bits of W are all '1' bits, and form a binary representation of $2^K-1$. This value is decremented in step s39 of coding-process-1 each time a source segment is correctly predicted, yielding $2^K-2$, $2^K-3$, and so on. The decrementing continues until either a source segment is incorrectly predicted or W becomes zero, at which point the K bits are output as a new coded segment. If A source segments have been correctly predicted, the value J of the new coded segment is $2^K-1-A$. That is, $$J = 2^K - 1 - A, \text{ hence}$$
$$A = 2^K - 1 - J.$$

In short, the coding process in FIGS. 7 to 13 operates as described in FIG. 1 and Table 1.

Figure 14:
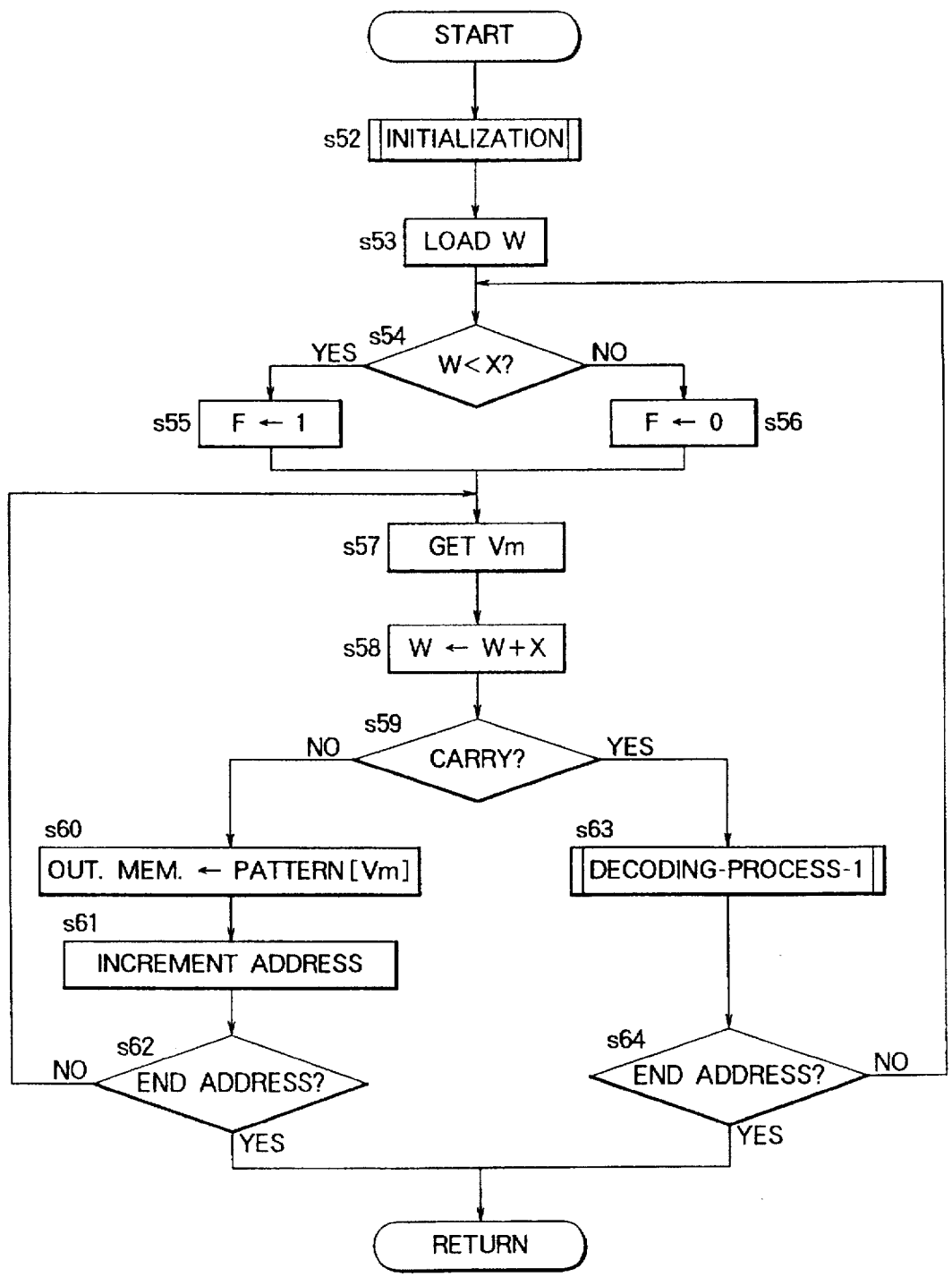
FIG. 14 is a flowchart of the decoding process executed by the first novel decoder.

FIG. 14 is a general flowchart of the decoding process carried out by the decoder in the first embodiment. This process will be described with reference to FIGS. 5 to 10, 14, and 15.

Step s52 is the initialization process of FIG. 7. The end address is initialized according to a value received in advance of the coded data, specifying the amount of decoded data that will be produced. For a bit-mapped image, the end address can be calculated from the size and pixel depth of the image, as mentioned earlier.

In step s53, the first bit of coded data is moved into the leftmost position of register 46, and other bits are moved into register 46 behind it, thereby filling register 46 with coded data. W denotes the value of all the data in register 46.

At the beginning of step s54, the leftmost K bits in register 46 form a coded segment that is about to be decoded. The steps from step s54 to step s64 form a loop that decodes this coded segment and any associated literal segment. K is initially one, so the first time this loop is executed, the coded segment is the single leftmost bit in register 46.

In step s54, the code interpreter 44 tests whether W is less than X, more precisely whether the value of the leftmost MAXK bits of W is less than X, where MAXK is the length of the register 37 containing the value of X. Specifically, subtractor 48 subtracts X from the leftmost MAXK bits of register 46. The borrow bit produced by this subtraction is stored as a flag F in flag register 49. The value of W remains unaltered; the difference W−X is not stored in register 46.

Since X has a '1' in the K-th bit position and zeros in the other positions, if the leftmost K bits of W are all zero, a borrow occurs and F is set to one in step s55. Otherwise, no borrow occurs and F is cleared to zero in step s56.

Next, in step s57, the address controller 19 sends the Vm address to the output memory unit 45, and the m already-decoded bits at this address are stored in register 23 as a reference value Vm. This step is skipped if any of these m bits have not yet been decoded, in which case the Vm value in register 23 remains zero. After Vm has been stored in register 23, the address controller 19 switches from output of the Vm address to output of the Vn address, in preparation for storing a decoded segment.

In step s58, adder 47 adds X to the leftmost MAXK bits of W and stores the result in register 46, thereby updating these MAXK bits. Since X has all zero bits to the right of the K-th bit position, this step changes only the leftmost K bits of W, which form the coded segment currently being decoded. The adder 47 supplies the carry bit produced by this addition to control unit 50.

Steps s57 and s58 are independent of one another, and can be carried out in either order, or concurrently.

In step s59, control unit 50 determines whether the addition in step s58 produced a carry, by observing whether the carry bit is zero or one.

If no carry was produced, in step s60 control unit 50 sets selector 51 to select the predicted value PATTERN[Vm], and this value is stored at the Vn address in the output memory unit 45. The address controller 19 then increments the Vm and Vn addresses in step s61, and compares the Vn address with the end address. The decoding process ends if the Vn address is the end address, and returns to step s57 if the Vn address is not the end address.

Steps s57 to s62 form a loop that keeps adding X to W until the leftmost K bits of W become zero, at which point a carry is detected in step s59. Each time a carry does not occur, a predicted value PATTERN[Vm] is stored as a decoded segment. If J 1s the original value of the leftmost K bits of W, this loop stores $2^K-1-J$ predicted values at successive Vn addresses in the output memory unit 45.

Figure 15:
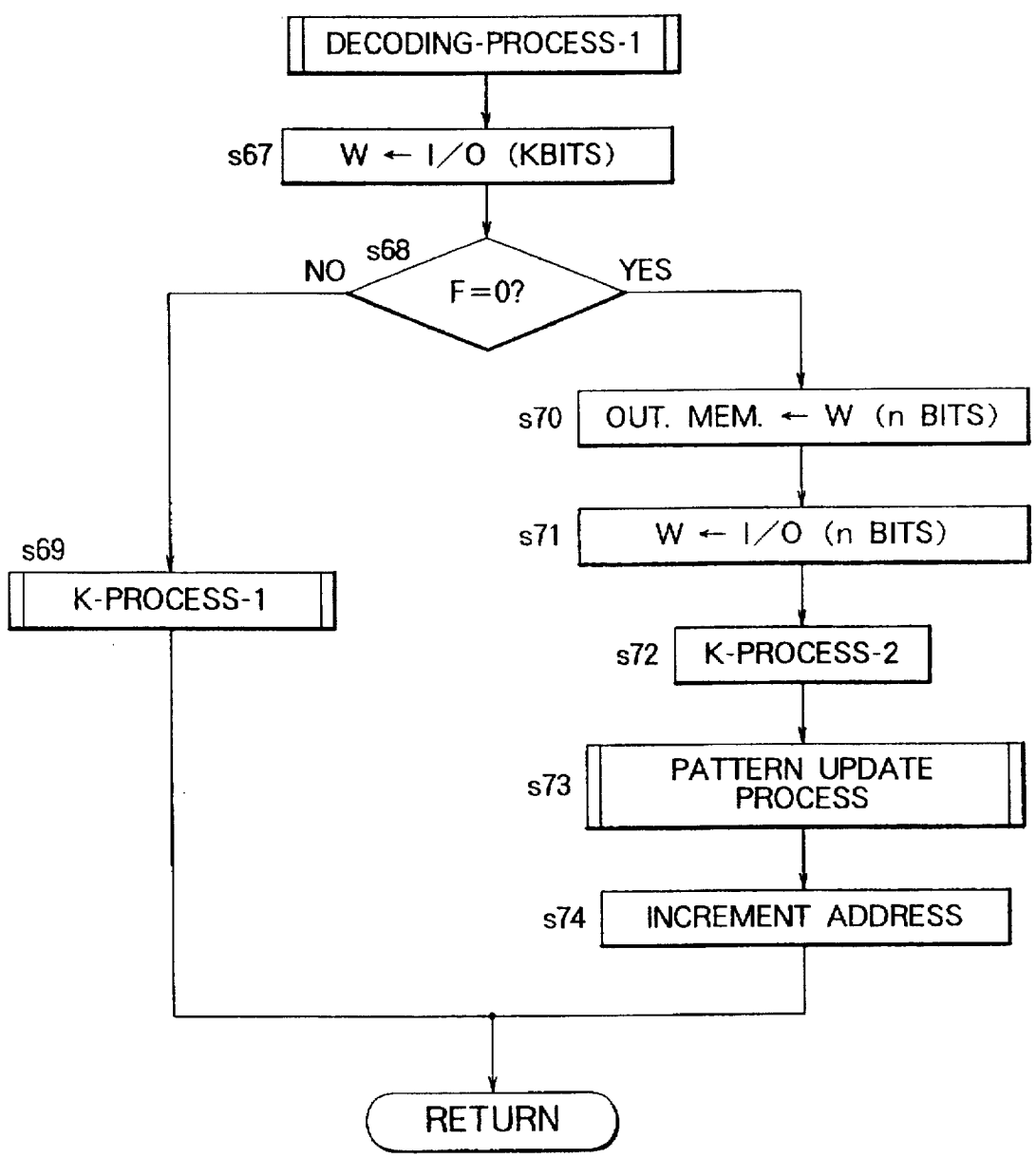
FIG. 15 is a more detailed flowchart of part of the process in FIG. 14.

When a carry is detected in step s59, in step s63 a process named decoding-process-1, described In FIG. 15, is carried out. After decoding-process-1, in step s64 the address controller 19 compares the Vn address with the end address, terminates decoding if the Vn address is the end address, and otherwise returns to step s54 to decode the next coded segment.

Referring to FIG. 15, in the first step s67 of decoding-process-1, K bits are moved from the code memory 82 into the K rightmost positions of register 46. This process pushes the leftmost K bits out of register 46, and moves all other bits in register 46 K positions to the left. The K bits pushed out of register 46 are not stored in the output memory unit 45.

In step s68, control unit 50 tests the borrow flag F in register 49. If F is one, indicating that the leftmost K bits in register 49 were originally all zero when tested in step s54 in FIG. 14, then K-process-1 is carried out in step s69. This process may increment the value of K, but does not store any new data in the output memory unit 45. This left branch of the flowchart in FIG. 15 is taken when the original coded segment was zero, signifying that $2^K-1$ segments were to be decoded by prediction, and none by copying literal segments. The $2^{K-1}$ segments have already been decoded in steps s57 to s62 in FIG. 14.

If the borrow flag F is zero in step s68, signifying that the original coded segment was not zero, then the right branch is taken in FIG. 15. In step s70, the leftmost n bits in register 46 are moved via selector 51 into the output memory unit 45 and stored at the Vn address. Since the original coded segment was non-zero, these n bits, which follow the original coded segment, are a literal segment. This step moves the entire contents of register 46 by n bits to the left, vacating the rightmost n bit positions. In step s71, n bits are moved from the code memory 82 into the vacated positions in register 46. Steps s70 and s71 may be carried out concurrently. Next, K-process-2 is carried out in step s72, possibly decrementing K, and the pattern update process is carried out in step s73.

During the pattern update process, if COUNT[Vm] is decremented to zero, the literal segment that was stored in the output memory unit 45 in step s70 is immediately read into register 24, then stored at address Vm in the predictor 25 to update PATTERN[Vm].

The right branch in FIG. 15 ends with step s74, which increments the Vn and Vm addresses in the address controller 19.

After either the left or right branch in FIG. 15, the leftmost K bits of register 46 hold the next coded segment.

As described above, the coder and decoder start from an identical initial state, perform identical operations on K and X, and perform identical updates of the prediction rule PATTERN[Vm]. This consistency ensures that the decoder recognizes coded segments correctly, and makes the same predictions as the coder. Consequently, the decoded data will be identical to the original data.

As a simple illustration of the above operations, the coding and decoding of source segments 15 and 17 in FIG. 2 will be described. Black will be encoded as '1' and white as '0;' hexadecimal notation will also be used for Vn and Vm. It will be assumed that m, n, and MAXK are all equal to eight, registers 39 and 46 are eight-bit registers, and that the starting conditions are:

$K=1$ $W=$'10000000'

$X=$'10000000'

$CNT1>1$

PATTERN[$E0$]=$F0$ (hexadecimal)

PATTERN[$DE$]=$EE$ (hexadecimal)

COUNT[$DE$]=1

When the coder codes source segment 15, steps s31 and s32 in FIG. 11 read the following values of Vn and Vm from the source memory unit 29:

$Vn=F0$ (hexadecimal)

$Vm=E0$ (hexadecimal)

Since Vn=PATTERN[Vm], coding-process-1 is carried out as shown in FIG. 12. In step s39, X is subtracted from W as follows:

```
  10000000
 -10000000
  00000000   (new value of W)
```

The finding in step s40 is that W is zero. In step s41 the leftmost bit ('0') if W is output as a coded segment.

Coded data output so far: '0'

Current value of W: '00000000'

Next K-process-1 is carried out as shown in FIG. 9. As K< MAXK in step s13, CNT1 is decremented in step s14. By assumption, CNT1 was greater than one, so the result in step s15 is that CNT1 is not zero, and steps s16 to s18 are skipped. In step s19, CNT2 is reinitialized to M.

Returning to FIG. 12, in step s43 X is subtracted from W again, as follows:

```
  00000000
 -10000000
  10000000   (new value of W)
```

Returning to FIG. 11, in step s36 the Vn and Vm addresses are incremented to designate segments 17 and 18 in FIG. 2, and the coding process loops through step s37 back to step s31.

Steps s31 and s32 next read the following values of Vn and Vm:

Vn=EF (hexadecimal)

Vm=DE (hexadecimal)

By assumption, PATTERN[DE]=EE, so Vn does not equal PATTERN[Vm], and coding-process-2 is carried out as shown in FIG. 13. Step s45 outputs the leftmost bit ('1') of W from register 39 as a coded segment. Steps s46 and s47 move Vn into register 39 and then to the code memory 81, outputting hexadecimal EF or binary '11101111' as a literal segment, and leaving zero in register 39 as the new value of W.

Coded data output so far: '0111101111'

Current value of W: '00000000'

Next K-process-2 is executed as shown in FIG. 10. The value of K is still one, so steps s22 to s26 are skipped. In step s27, CNT1 is reinitialized to M.

Next, the pattern update process is carried out as shown in FIG. 8. By assumption, COUNT[DE] is one, so in step s8, COUNT[DE] is decremented from one to zero, giving an affirmative result in step s9. In step s10, COUNT[DE] is reinitialized to S. In step s11, PATTERN[DE] is changed from hexadecimal EE to hexadecimal EF.

Returning to FIG. 13, in step s50 X is subtracted from W. Since W is zero, this operation is performed as follows:

$$\begin{array}{r} 00000000 \\ -10000000 \\ \hline 10000000 \end{array} \text{ (new value of } W\text{)}$$

Returning to FIG. 11, the Vn and Vm address are incremented in step s36, and the coding process either ends (if source segment 17 in FIG. 2 was the last segment), or returns to step s31 to code the next source segment.

The coded data '0111101111' output for source segments 15 and 17 are decoded as shown in FIGS. 14 and 15, starting from a state in which register 46 in the decoder contains the first eight of these coded bits.

Starting value of W in decoder: '01111011'

Other starting conditions are the same as they were in the coder.

Step s54 compares W with X, which is '10000000.' Since W is smaller, the borrow flag F is set to one.

Step s57 fetches segment 16 in FIG. 2, which has been decoded previously, and stores hexadecimal E0 in register 23 as Vm.

Step s58 adds X to W as follows:

$$\begin{array}{r} 01111011 \\ +10000000 \\ \hline 11111011 \end{array} \text{ (new value of } W\text{)}$$

This operation does not produce a carry, so next, step s60 stores PATTERN[Em], which by assumption is hexadecimal F0 (binary '11110000'), in the output memory unit 45 as the decoded value of segment 15 in FIG. 2. Steps s61 and s62 increment the Vn and Vm addresses and return to step s57.

Decoded data so far: '11110000'

Current value of W: '11111011'

Step s57 now fetches segment 18 in FIG. 2, which has been decoded earlier, and stores hexadecimal DE in register 23 as the value of Vm. Step s58 adds X to W as follows:

$$\begin{array}{r} 11111011 \\ +10000000 \\ \hline 01111011 \end{array} \text{ (new value of } W\text{)}$$

This operation produces a carry, so decoding-process-1 is carried out as shown In FIG. 15.

Step s67 moves the next coded bit ('1') into the rightmost position of register 46, pushing out the leftmost bit ('0').

Current value of W: '11110111'

The value of F is not zero, so decoding proceeds from step s68 to K-process-1. This process is carried out in the same way as it was in the coder, step s14 decrementing CNT1 to a non-zero value, steps s16 to s18 being skipped, and step s19 reinitializing CNT2.

Returning to FIG. 14, step s64 next tests the Vn address, which is still the address of segment 17 in FIG. 2. This is not the end address, so the decoding process loops back to step s54.

Step s54 now finds that W ('11110111') is not less than X ('10000000'). The borrow flag F is cleared to zero in step s56. Step s57 again fetches segment 18 and places hexadecimal DE in register 23 as Vm, while step s58 adds X to W as follows:

$$\begin{array}{r} 11110111 \\ +10000000 \\ \hline 01110111 \end{array} \text{ (new value of } W\text{)}$$

This operation produces a carry, so decoding-process-1 in FIG. 15 is carried out once more.

Step s67 moves the next coded bit ('1') into register 46, pushing out the leftmost bit ('0').

Current value of W: '11101111'

The borrow flag F is zero, so the right branch in FIG. 15 is taken. Step s70 moves the leftmost eight bits of register 46, which in this example form the entire contents of register 46, into the output memory unit 45 as the decoded value of segment 17.

Data decoded so far: '1111000011101111'

Step s71 then moves eight new bits of coded data (not shown) into register 46. Step s72 carries out K-process-2 as was done in the coder, and step s73 changes PATTERN[DE] from EE to EF, also as in the coder.

As the above description makes clear, the first embodiment performs no probability calculations, and enables data to be accessed in convenient units such as eight bits or one byte at a time. For these reasons, the first embodiment is several times faster than arithmetic coding. The data compression ratio attained by the first embodiment for typical dithered images is moreover only a little less than the compression ratio attained by arithmetic coding. The inventor has evaluated the effectiveness of the first embodiment and a conventional arithmetic coder by using them to code a certain dithered image and dividing the compression ratio by the elapsed time of the coding process. The results are shown in Table 2.

TABLE 2

|  | Coding | Decoding |
| --- | --- | --- |
| First embodiment | 8.33 | 8.15 |
| Arithmetic coder | 2.66 | 2.71 |

In terms of amount of compression per amount of processing, the first embodiment outperformed the arithmetic coder in both coding and decoding. For a page printer, this could mean the difference between printing at top speed and at a slower speed. The arithmetic coder in this evaluation was the QM coder described in the standard set forth by the Joint Bilevel Image Experts Group (JBIG), with probabilities being obtained from seven reference symbols.

Compared with run-length coding, the first embodiment gives superior compression of dithered images because of its ability to encode by prediction not only runs of black or white, but checkerboard patterns and other dither patterns. The prediction rule controller 27 enables the first embodiment to adapt to arbitrary dither patterns.

Figure 16:
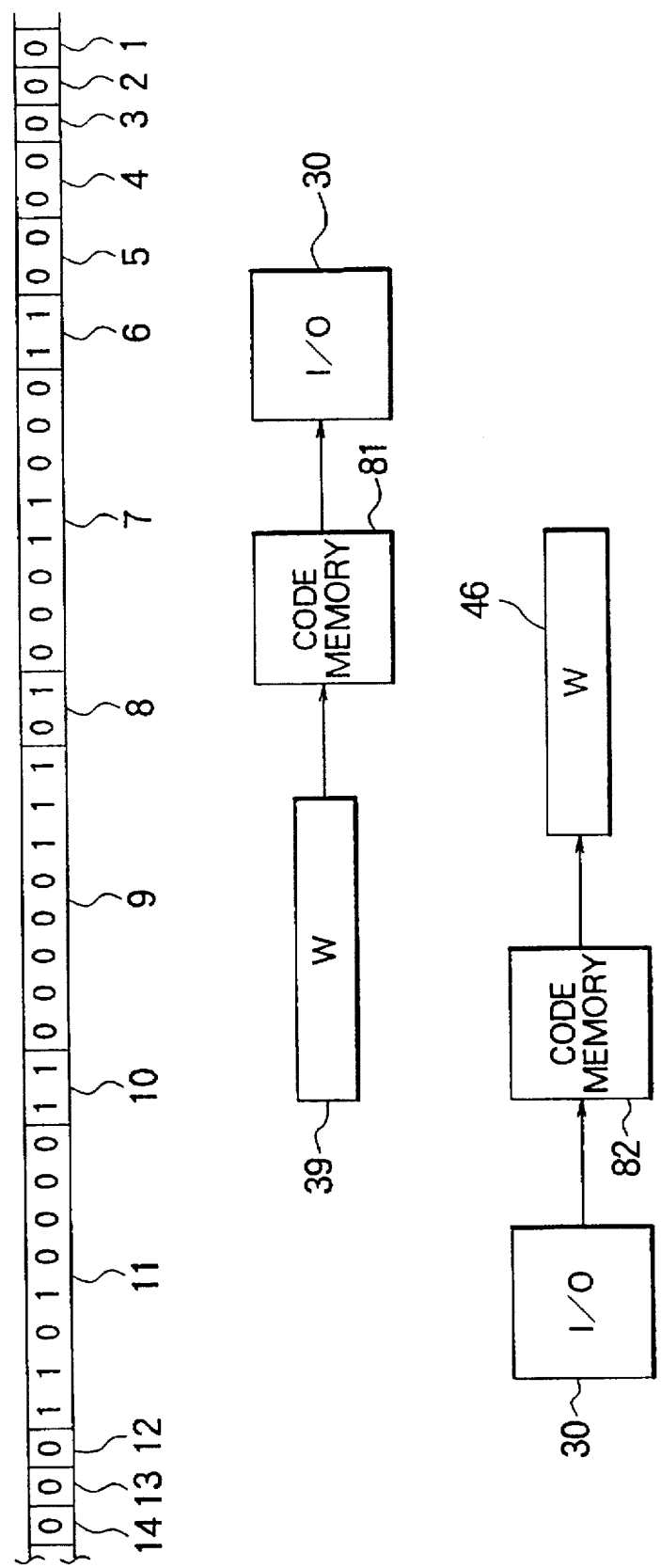
FIG. 16 illustrates a variation of the bit stream coded by the first embodiment of the invention.

The first embodiment is capable of extensive modification and variation, not only regarding the circuit configurations shown in FIGS. 3 to 6 and processes shown in FIGS. 7 to 15, but also in regard to the order in which the coded data are output. For example, the coded data can be output in order from right to left, as shown in FIG. 16, instead of from left to right as described above. In this case coded data are moved into the code memory 81 from the right end of register 39 in the coder, and from the code memory 82 into the left end of register 46 in the decoder, as illustrated in FIG. 16.

The coded segments and literal segments have the same reference numerals in FIG. 16 as in FIG. 2, and the individual values of these coded segments and literal segments are also the same. The coded data In FIG. 16 can be produced by substantially the same coder circuit as shown in FIGS. 3 and 4, except that the value of X in register 37 always consists of a single '1' bit in the rightmost bit position, instead of the K-th position from the left. That is, X has a fixed value of '0...0001.' The same modification is made in the decoder, together with a further modification: it is necessary to extract the rightmost K bits of W into a separate register and perform arithmetic operations on W in that separate register, so that borrows and carries will not affect the coded data to the left.

The variation illustrated In FIG. 16 has the advantage that the K–X converter 36 can be eliminated. For software implementations, addition and subtraction operations can be replaced with increment and decrement operations, which may be of some advantage.

Second embodiment

Figure 17:
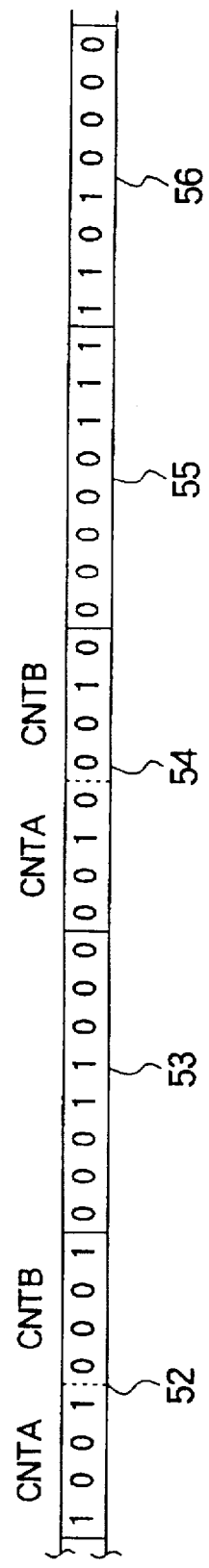
FIG. 17 illustrates a bit stream coded by a second embodiment of the invention.

FIG. 17 illustrates a coded bit stream encoded by a second embodiment of the invention, in which the length K of the coded segments is fixed. In FIG. 17 this fixed length is eight bits, the same as the length of the literal segments.

As in the first embodiment, each coded segment yields a pair of non-negative integers, the first designating a number of segments coded by prediction, the second a number of literal segments embedded in the coded data. In FIG. 17 these two non-negative integers are denoted CNTA and CNTB. Both are ordinary unsigned four-bit binary integers, representing values from zero to fifteen.

In FIG. 17, coded segment 52 indicates that nine consecutive segments are to be decoded by prediction, after which the next segment is to be copied from literal segment 53. Coded segment 54 indicates that the next two segments are to be decoded by prediction, after which two literal segments 55 and 56 are to be copied. FIG. 17 encodes the same information as coded data i to 11 in FIG. 1.

Figure 18:
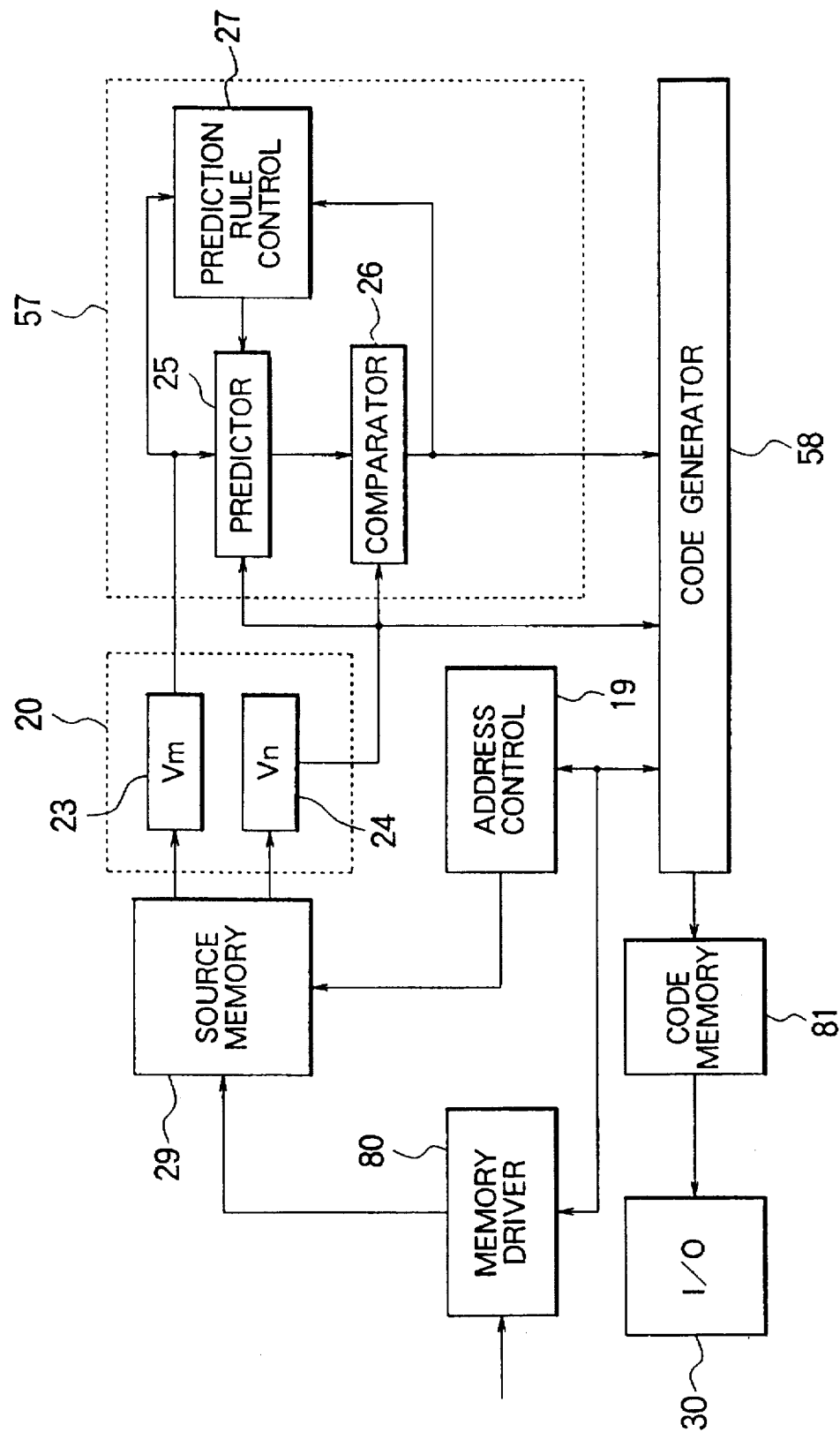
FIG. 18 is a block diagram of a second novel coder.

FIG. 18 shows the coder configuration in the second embodiment, using the same reference numerals as in FIG. 3 for equivalent elements. Vm and Vn have the same meaning as in the first embodiment. The coding model circuit 57 and code generator 58 in the second embodiment differ from the coding model circuit 21 and code generator 22 in the first embodiment, the coding model circuit 57 having no length controller 28. Other elements, including the predictor 25, comparator 26, and prediction rule controller 27, are the same as the corresponding elements in the first embodiment.

Figure 19:
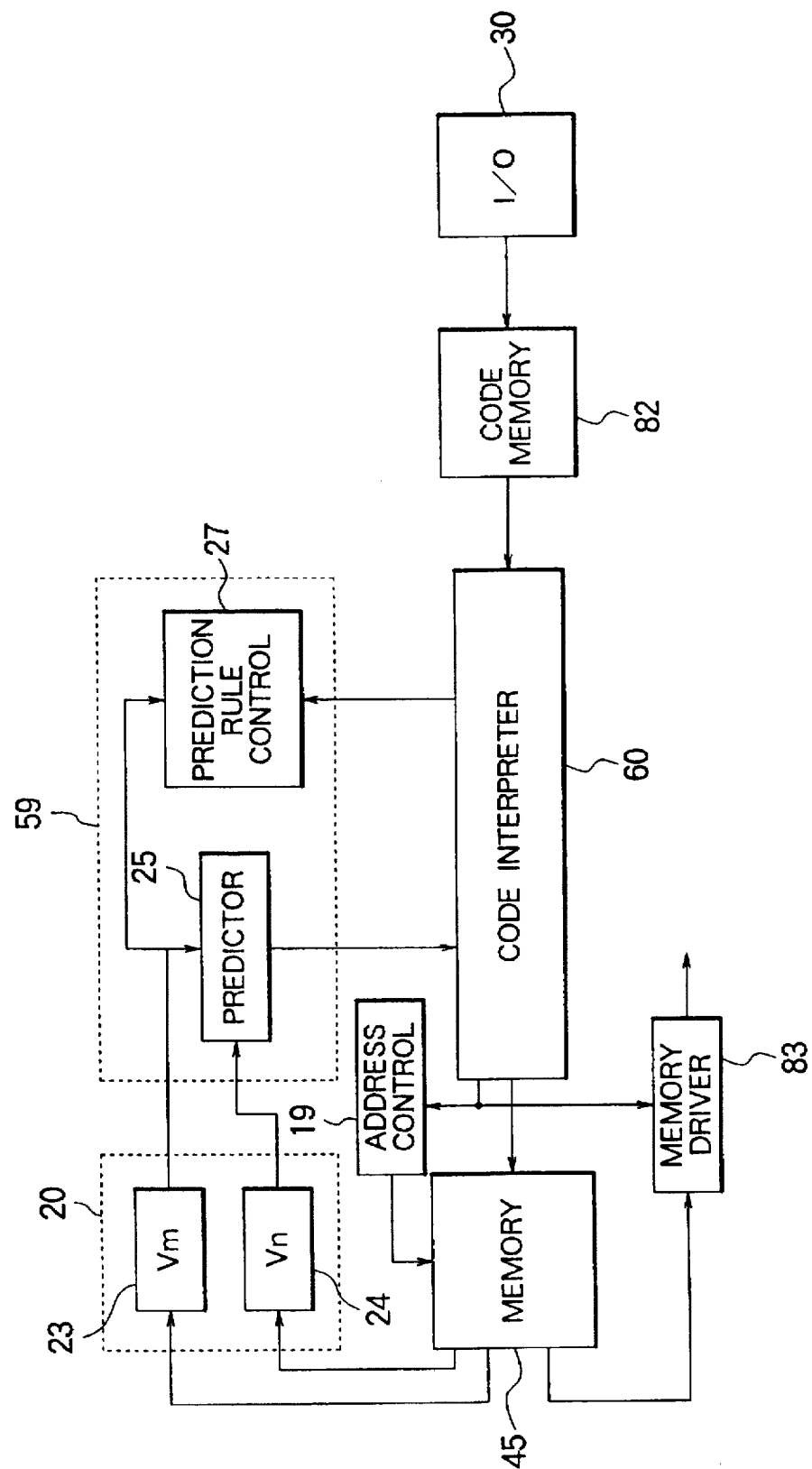
FIG. 19 is a block diagram of a second novel decoder.

FIG. 19 shows the decoder configuration in the second embodiment, using the same reference numerals as in FIG. 5 for equivalent elements. The decoding model circuit 59 and code interpreter 60 in the second embodiment differ from the decoding model circuit 43 and code interpreter 44 in the first embodiment, the decoding model circuit 59 again having no length controller 28. Other elements, including the predictor 25 and prediction rule controller 27, are the same as the corresponding elements in the first embodiment.

Detailed drawings of the code generator 58 and code interpreter 60 will be omitted. These units are generally similar to the code generator 22 and code interpreter 44 in the first embodiment, except that instead of adding or subtracting X, they increment or decrement CNTA and CNTB. The code generator 58 has an internal buffer for storing up to a certain number MAXB of literal segments, and an internal register Z for storing a value of zero or one. The code interpreter 60 has an internal register W for storing at least n or K bits, whichever is larger. Both the code generator 58 and code interpreter 60 have internal registers for storing the values of CNTA and CNTB.

The operation of the second embodiment will be described with reference to the flowcharts in FIGS. 20 to 24.

Figure 20:
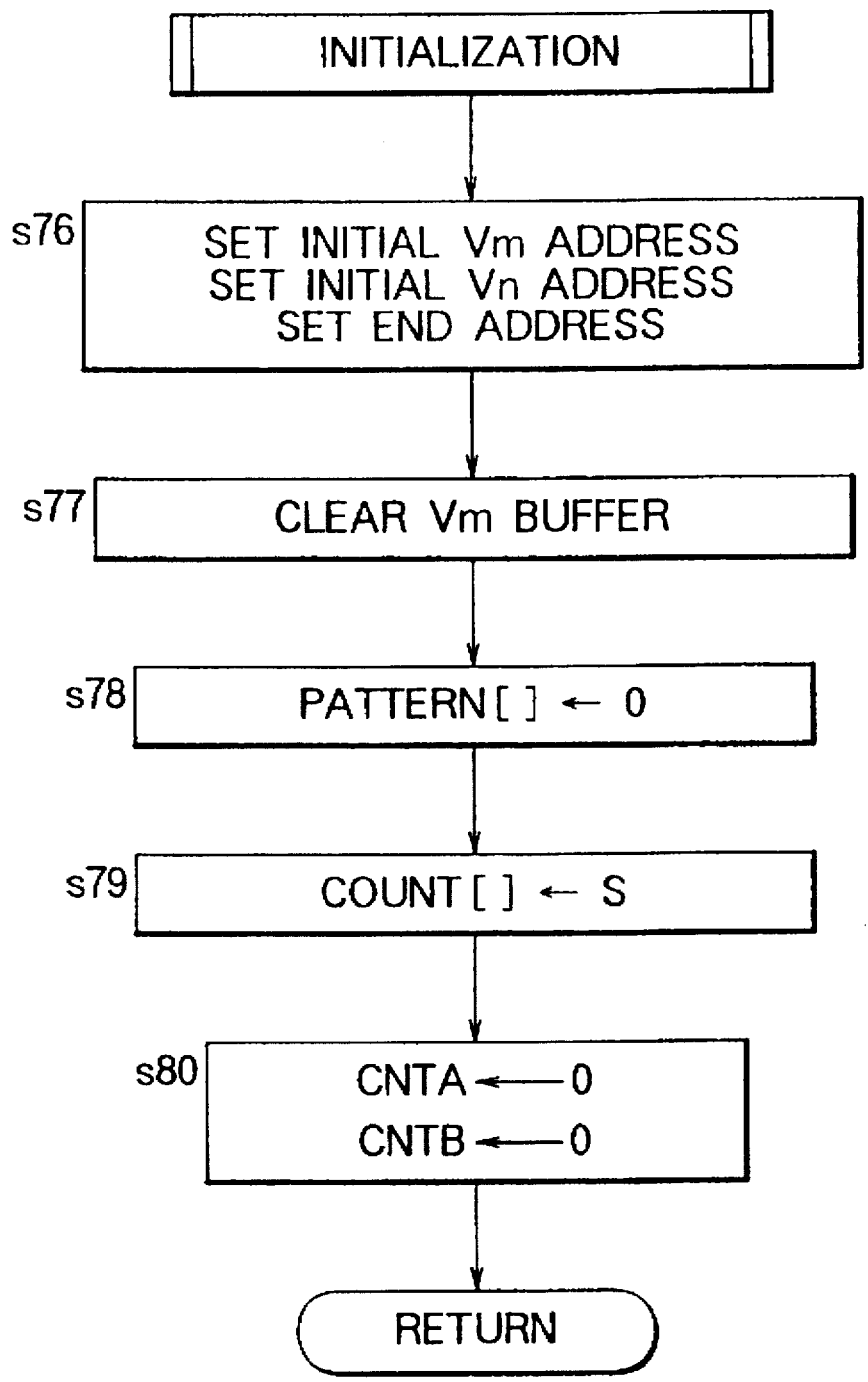
FIG. 20 is a flowchart of an initialization process in the second embodiment.

FIG. 20 illustrates an initialization process common to the coder and decoder in the second embodiment. Steps s76, s77, s78, and s79 are identical to steps s1, s2, s3, and s4 in FIG. 7, initializing the address controller 19, clearing the buffer unit 20 and predictor 25, and Initializing the prediction rule controller 27. Step s80 initializes CNTA and CNTB to zero in the code generator 58 or code interpreter 60.

Figure 21:
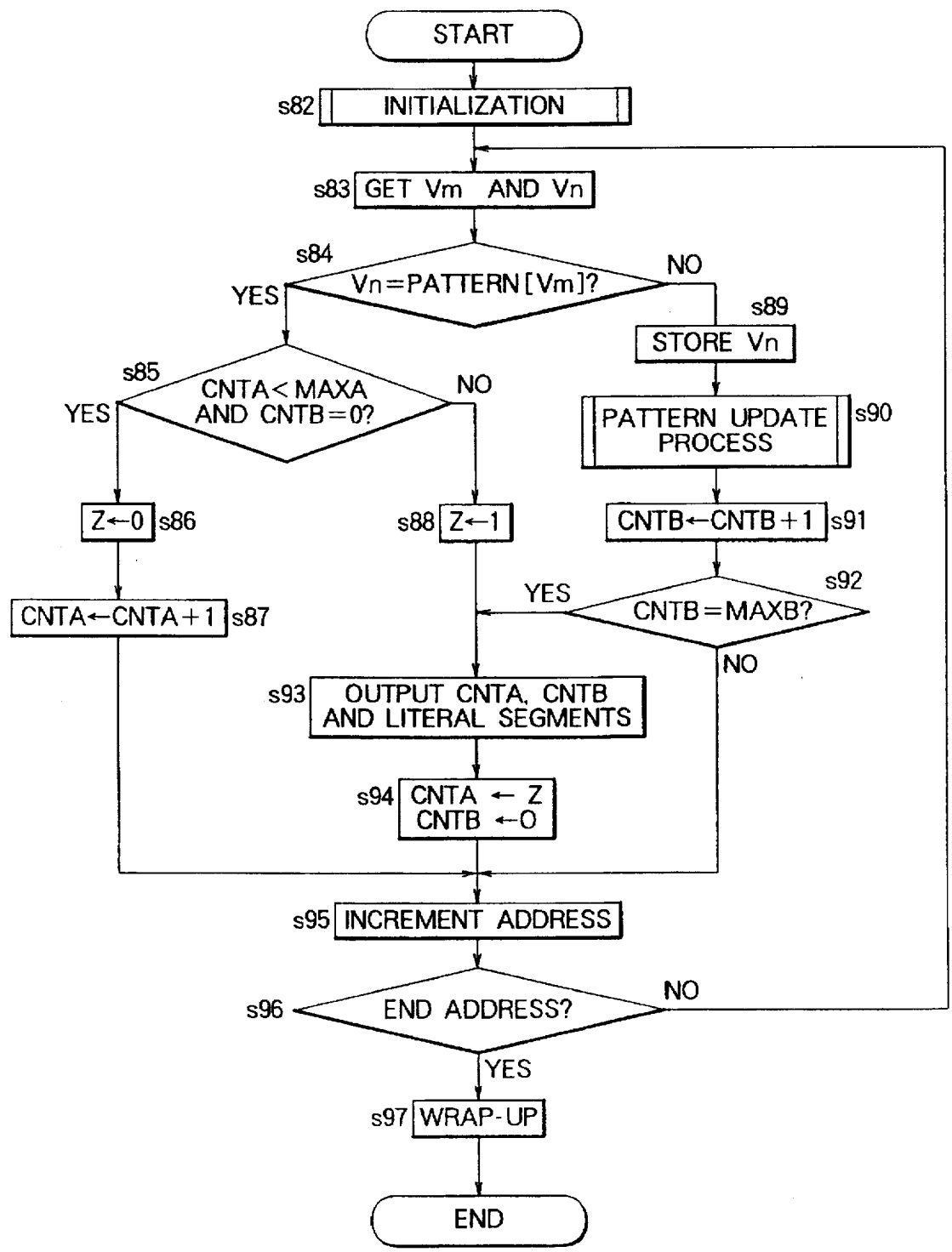
FIG. 21 is a flowchart of the coding process executed by the second novel coder.

FIG. 21 illustrates the coding process. The logic of this flowchart is basically as follows. The coder starts by counting consecutive correctly-predicted segments, until an incorrect prediction occurs. The coder then counts consecutive incorrectly-predicted segments, until a correct prediction occurs. When this point is reached, the coder outputs a coded segment and the associated literal segments. Output may occur before this point is reached, to keep the count of correctly- or incorrectly-predicted segments from exceeding a maximum allowable value.

The maximum allowable values are denoted MAXA and MAXB. If CNTA and CNTB are four-bit binary numbers as in FIG. 16, then MAXA and MAXB are both fifteen.

Step s82 in FIG. 21 is the initialization process shown in FIG. 20. Steps s83 to s96 form a loop that is executed once per data segment Vn.

Step s83 stores Vm and Vn in registers 23 and 24 in the buffer unit 20. This step is identical to the combination of steps s31 and s32 in the first embodiment.

Step s84 compares Vn with PATTERN[Vm], as in step s33 in the first embodiment.

If Vn is correctly predicted by PATTERN[Vm], the code generator 58 tests CNTA and CNTB in step s85. If CNTA is less than MAXA and CNTB is zero, indicating that the coder is still in the process of counting consecutive correctly-predicted segments for the current coded segment, the code generator 58 clears the above-mentioned value Z to zero in step s86, increments CNTA in step s87, and proceeds to step s95.

If CNTA has reached its maximum value MAXA or CNTB is not zero, the coding process proceeds from step s85 to step s88, in which Z is set to one, then to step s93.

If Vn is not correctly predicted by PATTERN[Vm], after step s84, the code generator 58 stores the incorrectly predicted segment Vn in an internal buffer memory in step s89, the prediction rule controller 27 carries out the pattern update process in step s90, the code generator 58 increments CNTB in step s91, and the code generator 58 compares the incremented value of CNTB with the maximum value MAXB in step s92. The coding process proceeds to step s93 if CNTB is equal to MAXB, or to step s95 if CNTB is less than MAXB.

In step s93, the code generator 58 concatenates CNTA and CNTB and outputs them as a coded segment to the code memory 81, then outputs the number of literal segments designated by CNTB from its internal buffer to the code memory 81. If CNTB is zero, no literal segments are output.

In step s94, the code generator 58 sets CNTA to the value of Z, and clears CNTB to zero.

In step s95, the address controller 19 increments the Vm and Vn addresses. In step s96, the new Vn address is compared with the end address, and the decoding process returns to step s83 if there are more data to code.

If the Vn address is the end address, a wrap-up step s97 is performed to output the final coded segment and associated literal segments. Wrap-up step s97 is identical to step s93, except that if CNTA and CNTB are both zero, output of the final coded segment can be omitted. The wrap-up step may also include the output of final dummy data, if necessary.

Figure 22:
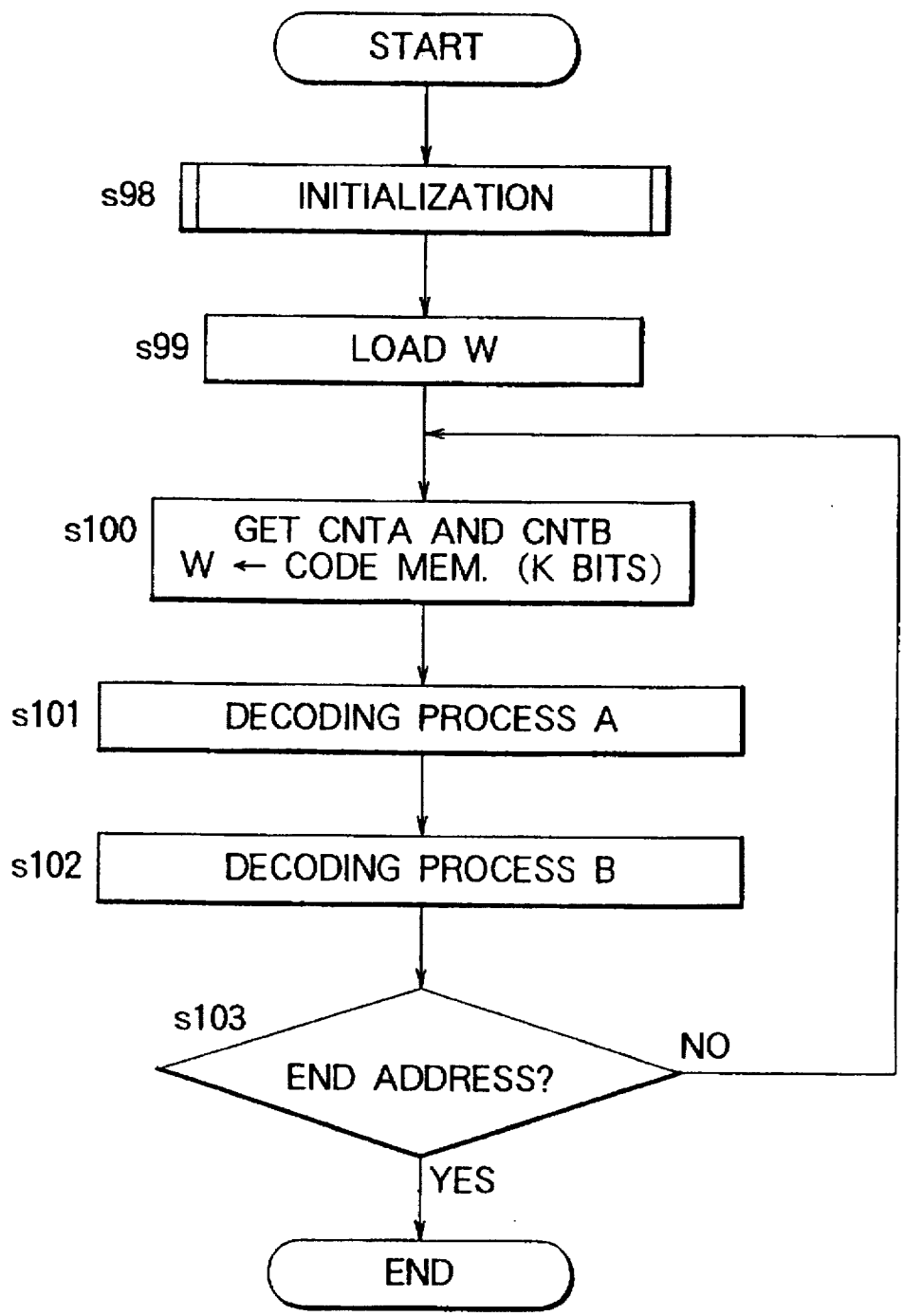
FIG. 22 is a flowchart of the decoding process executed by the first novel decoder.

FIG. 22 illustrates the decoding process performed by the decoder in the second embodiment. This process will be described with reference to FIGS. 19 to 24.

Step s98 is the initialization step shown in FIG. 20. In step s99, the code interpreter 60 loads the initial bits of coded data into its internal register W, placing the first coded segment at the front of register W.

In step s100, the code interpreter 60 extracts the values of CNTA and CNTB from the coded segment at the front of register W, stores CNTA and CNTB internally, then moves the next K bits from the code memory 82 into register W. This operation pushes out the coded segment Just read, so that the next coded segment or literal segment is placed at the front of register W.

The next two steps s101 and s102 are processes named decoding-process-A and decoding-process-B, which decode predicted and literal segments, respectively, as described below in FIGS. 23 and 24.

In step s103, the Vn address is compared with the end address. If the end address has not been reached, the decoding process returns to step s99 to read and process the next coded segment.

Figure 23:
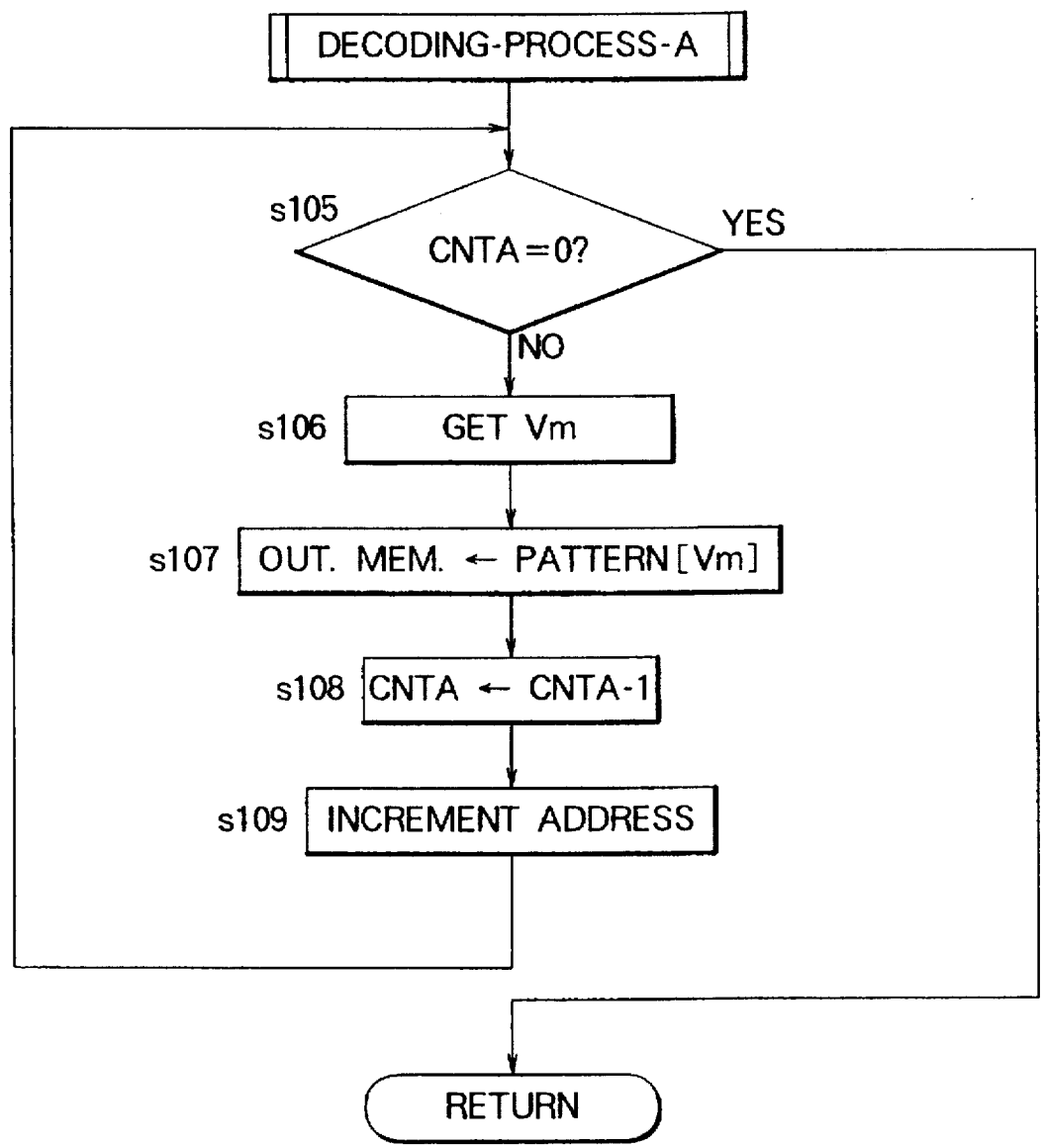
FIG. 23 is a more detailed flowchart of part of the process in FIG. 22.

Decoding-process-A, shown in FIG. 23, decodes the number of segments designated by CNTA.

In step s105, the code interpreter 60 tests CNTA. Decoding-process-A ends when CNTA is zero.

In step s106, the address controller 19 outputs the Vm address. The value of Vm, which has been decoded earlier, is read from this address in the output memory unit 45, placed in register 23, and supplied to the predictor 25.

In step s107, the predictor 25 outputs PATTERN[Vm] to the code interpreter 60, the address controller 19 outputs the Vn address, and the code interpreter 60 stores PATTERN[Vm] as a decoded segment in the output memory unit 45.

In step s108, the code interpreter 60 decrements CNTA. In step s109, the address controller 19 increments the Vm and Vn addresses, after which decoding-process-A loops back to step s105.

Figure 24:
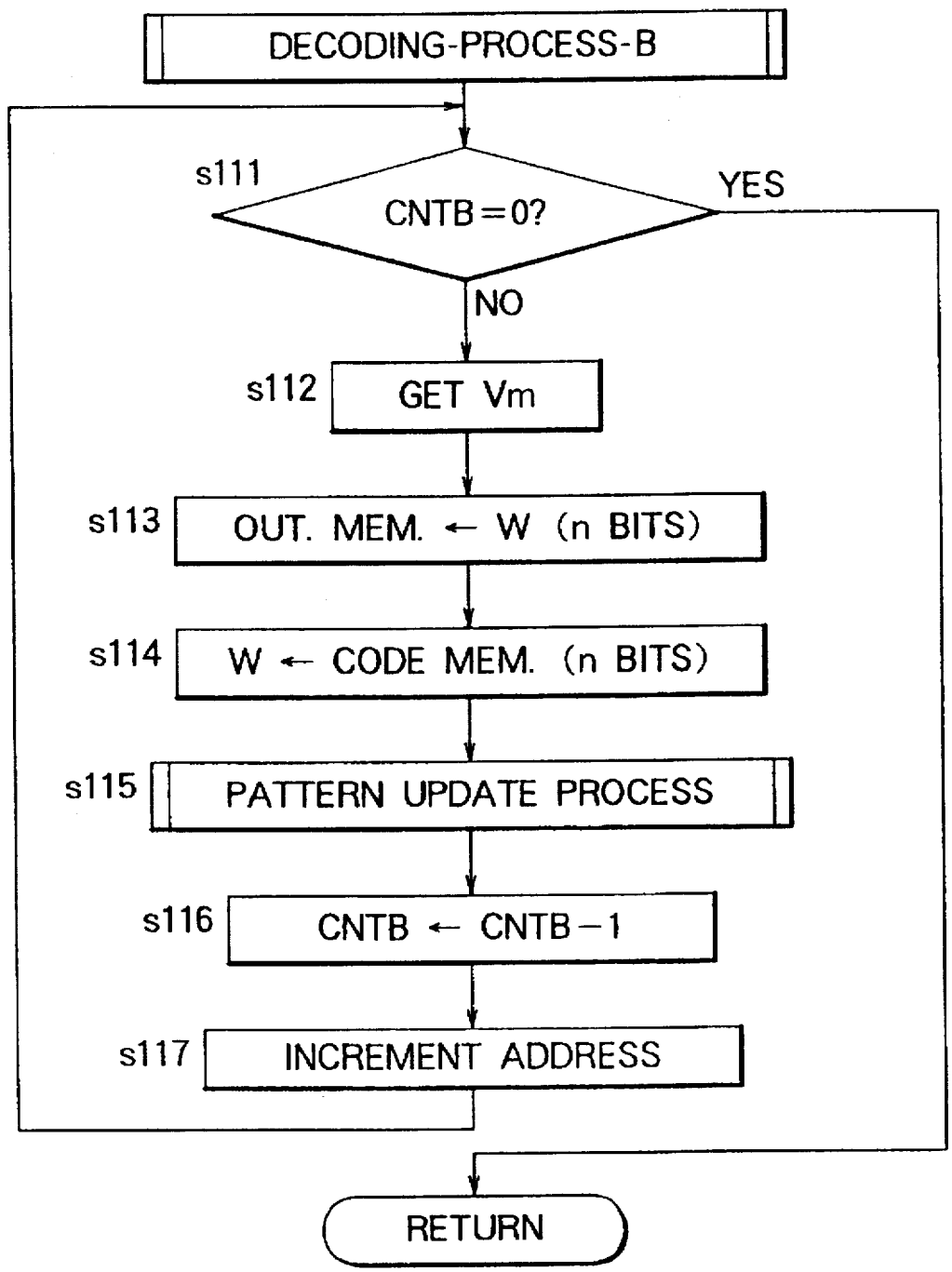
FIG. 24 is a more detailed flowchart of another part of the process in FIG. 22.

Decoding-process-B, shown in FIG. 24, copies the number of literal segments designated by CNTB.

In step s111, the code interpreter 60 tests CNTB. Decoding-process-B ends when CNTB is zero.

In step s112, the address controller 19 outputs the Vm address. The Vm value stored at this address is placed in register 23 and supplied to the predictor 25 and prediction rule controller 27.

In step s113, the address controller 19 outputs the Vn address, and the code interpreter 60 copies one literal segment from the front n bits of register W to the Vn address in the output memory unit 45.

In step s114, the code interpreter 60 moves the next n bits from the code memory 82 into the back n bit positions of register W, thereby pushing out the literal segment that has just been copied from the front n bit positions.

Step s115 is the pattern update process described in FIG. 8.

In step s116, the code interpreter 60 decrements CNTB. In step s117, the address controller 19 increments the Vm and Vn addresses, after which decoding-process-B loops back to step s111.

As an example of the operation of the second embodiment, the coding process that produced FIG. 17 will be described. The data coded in this drawing consist of nine correctly predicted source segments, followed by one incorrectly predicted source segment, two correctly predicted source segments, two incorrectly predicted source segments, and further correctly predicted source segments. MAXA and MAXB are fifteen.

The coding process starts, for example, with CNTA and CNTB both equal to zero. As the first nine consecutive source segments are predicted correctly, the coder obtains affirmative results in steps s84 and s85 in FIG. 21, and increments CNTA nine times in step s87, raising the value of CNTA from zero to nine, or binary '1001.'

The next source segment is predicted incorrectly, so the coder obtains a negative result In step s84, stores the value of this source segment ('00011000') internally, carries out the pattern update process, and increments CNTB from zero to one, or binary '0001,' obtaining a negative result in step s92.

The next source segment is predicted correctly. The coder obtains an affirmative result in step s84, but a negative result in step s85 because CNTB is not zero. Z is accordingly set to one in step s88. CNTA and CNTB are concatenated in step s93 to form '10010001,' which is output as coded segment 52 in FIG. 17, followed by output of the internally-stored '00011000' as literal segment 53. After this output, CNTA is set to one and CNTB is cleared to zero in step s94.

Coded data output so far: '10010001 00011000'

Another correctly predicted source segment is now encountered, giving affirmative results in steps s84 and s85. The coder increments CNTA from one to two, or binary '0010.'

Next, two source segments with binary values '00000111' and '11010000' are predicted incorrectly, giving negative results in step s84. The coder stores these two segments internally, performs the pattern update process for each segment, and increments CNTB twice, from zero to two (binary '0010'), both times obtaining negative results in step s92.

The next prediction is correct, giving an affirmative result in step s84 and a negative result in step s85. The coder sets Z to one again, concatenates CNTA and CNTB to obtain coded segment '00100010,' and outputs this coded segment, followed by the two Internally-stored literal segments '00000111' and '11010000.'

Coded data output so far: '10010001 00011000 00100010 00000111 11010000'

Because K is fixed, the coding and decoding processes are simpler In the second embodiment than in the first embodiment, making the second embodiment faster when implemented in software. The second embodiment does not achieve as high a compression ratio as the first embodiment, however.

The process flows shown in FIGS. 20 to 24 can be modified in many ways. The coding process in FIG. 21, for example, can be structured as two independent loops: a first loop executed until an incorrect prediction is made or CNTA is exceeded; and a second loop executed until a correct prediction is made or CNTB is exceeded. It is not necessary for the coded segments to have the same length (K) as the literal segments (n).

Third embodiment

The third embodiment adds a data modification process to the first embodiment.

The inventor has found that the appearance of bit-mapped images tends not to be noticeably altered by minor changes in segments in which black and white are already intermixed to a certain degree. This degree can be expressed as, for example, the number of times the symbol value in the segment switches between black and white. In eight-symbol segments in which the symbol value switches at least three times, for example, a one-symbol alteration of the data is not likely to be noticeable.

Figure 25:
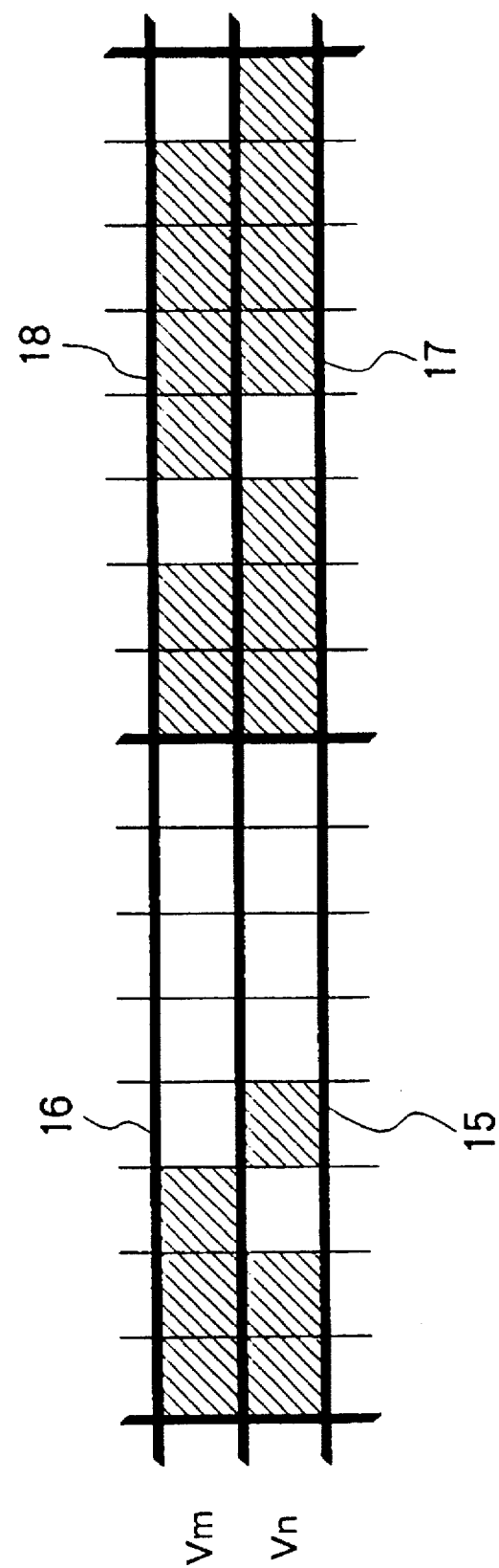
FIG. 25 illustrates image prediction in a third embodiment of the invention.

For example, FIG. 25 shows part of a bit-mapped image which is identical to the one in FIG. 2, except that the third symbol from the left in segment 15 has been changed from black to white. The idea in the third embodiment is that changing this symbol back to black would not significantly affect the appearance of the image.

Figure 26:
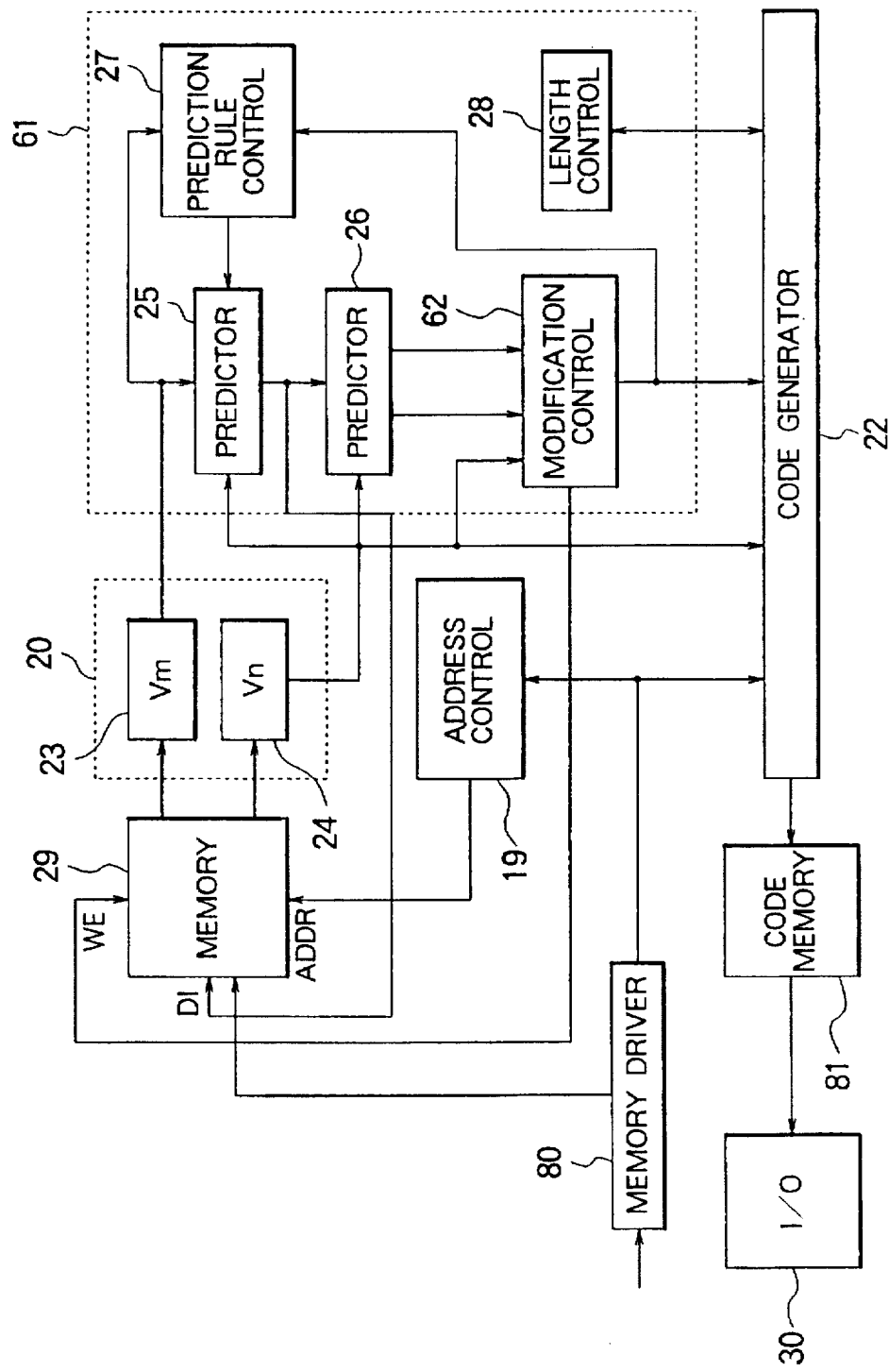
FIG. 26 is a block diagram of a third novel coder.

FIG. 26 shows the configuration of the coder in the third embodiment, using the same reference numerals as in FIG. 3 to indicate equivalent or identical elements. The only differences from FIG. 3 concern the comparator 26 in the coding model circuit 61, a modification controller 62 added to the coding model circuit 61, and the interconnections of the coding model circuit 61 to the source memory unit 29. The source memory unit 29 now receives PATTERN[Vm] as input data (DI) from the predictor 25, and receives a write enable signal (WE) from the modification controller 62.

Figure 27:
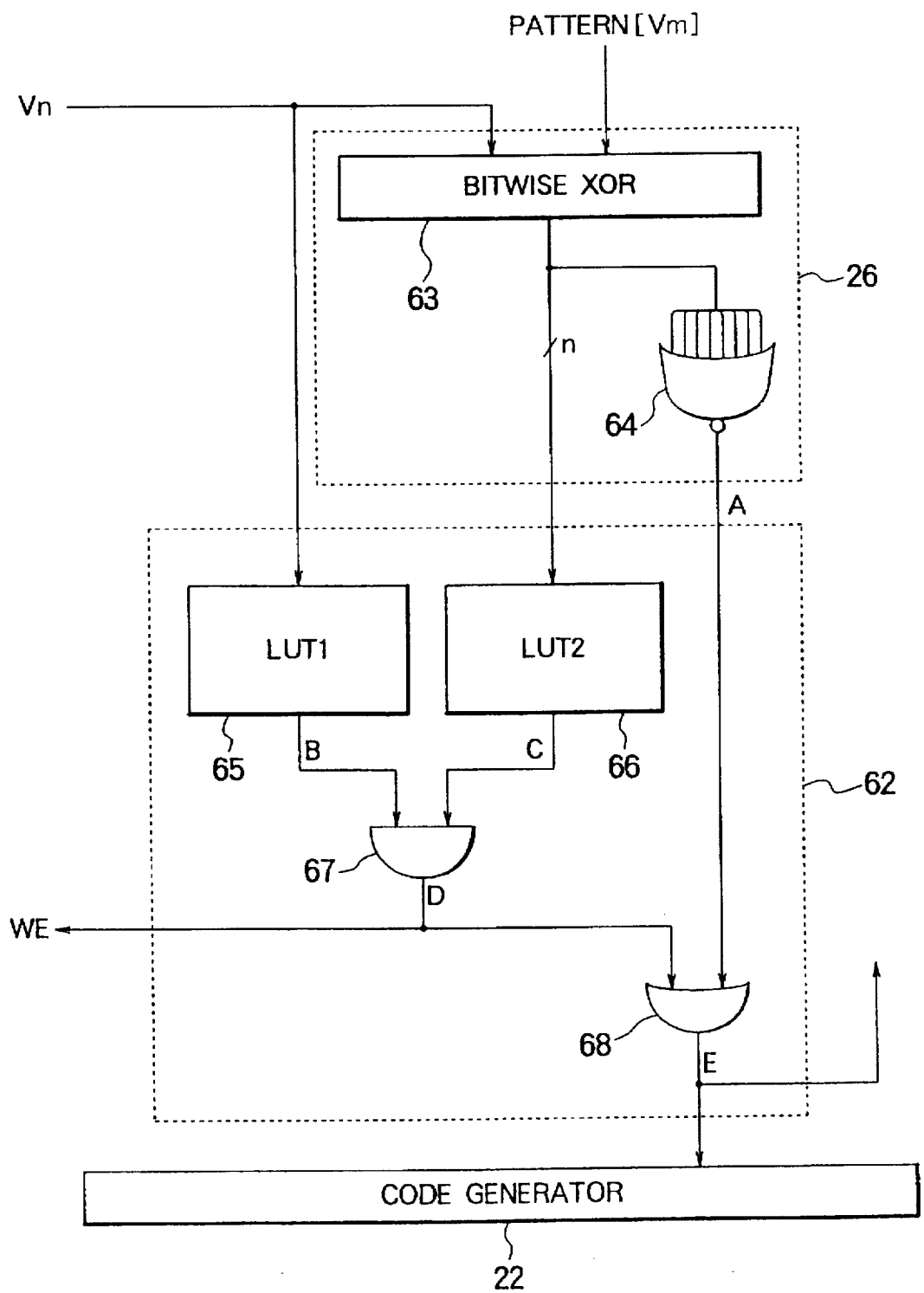
FIG. 27 is a more detailed block diagram of the modification controller in the third novel coder.

FIG. 27 shows the comparator 26 and modification controller 62 in more detail.

The comparator 26 in the third embodiment comprises a bitwise exclusive-OR circuit 63 and an n-input NOR gate 64. The bitwise exclusive-OR circuit 63 carries out a bitwise exclusive-OR logic operation on Vn and PATTERN[Vm], producing an n-bit output having a '1' in each bit position at which Vn and PATTERN[Vm] differ, and a '0' in each bit position at which Vn and PATTERN[Vm] are the same. The NOR gate 64 takes the logical NOR of these n bits, producing a signal A which is high when Vn and PATTERN[Vm] are identical and low when they are not.

The modification controller 62 comprises a pair of look-up tables 65 and 66, an AND gate 67, and an OR gate 68.

The first look-up table (LUT1) 65 is, for example, a read-only memory that receives Vn as an address input signal and outputs a single bit B indicating whether Vn satisfies a certain modification condition. Source segments satisfying this condition will be referred to as modifiable segments. If the modification condition mentioned above is used, then B is '1' when the bit value changes between '1' and '0' at least three times within Vn, and is '0' when the bit value changes fewer than three times within Vn.

The invention is, of course, not limited to this or any other particular modification condition.

The second look-up table (LUT2) 66 is, for example, a read-only memory that receives the output of the bitwise exclusive-OR circuit 63 as an address, and outputs a single bit C indicating whether Vn and PATTERN[Vm] are almost the same. If "almost the same" is defined to mean differing in only one bit, then C is '1' if the output of the bitwise exclusive-OR circuit 63 contains exactly one '1' bit, and is '0' if the output of the bitwise exclusive-OR circuit 63 contains more than one '1' bit, or contains no '1' bits. When C is '1,' source segment Vn is said to have been almost correctly predicted by PATTERN[Vm].

Almost correctly predicted segments can, of course, be defined in other ways. The invention is not limited to any particular definition of "almost."

AND gate 67 takes the logical AND of B and C and outputs a signal D which is active ('1') when Vn is a modifiable segment that was almost correctly predicted, and inactive ('0') in other cases. D is supplied as a write enable signal to the source memory unit 29 in FIG. 26.

OR gate 68 takes the logical OR of signals A and D, and outputs a signal E that is active ('1') when Vn and PATTERN[Vm] are equal, is also active when Vn and PATTERN[Vn] are almost equal and Vn is modifiable, and is inactive in other cases. E is supplied as a modified comparator output to the code generator 22, and to the prediction rule controller 27 in FIG. 26.

The third embodiment employs the same decoder as the first embodiment, shown in FIGS. 5 and 6.

The coding operation of the third embodiment will be described for source segments 15 and 17 in FIG. 25, using the modification condition and definition of almost correct prediction given above. The current state of the coder will be assumed to be as follows:

$K=1$, $CNTI>1$,

PATTERN[$E0$]=$F0$,

PATTERN[$DE$]=$EE$, and

COUNT[$DE$]=1.

When segment 15 is coded, the coder predicts hexadecimal F0 or binary '11110000' instead of the correct value of D0 or '11010000.' The bitwise exclusive-OR circuit 63 in FIG. 27 takes the exclusive logical OR of these values as follows, showing that they disagree in one bit position.

```
    11110000  (PATTERN[Vm])
XOR 11010000  (Vn)
    ────────
    00100000
```

NOR gate 64 outputs a '0' indicating that the prediction was incorrect, but look-up table 65 tests Vn against the modification condition and outputs a '1,' indicating that Vn ('11010000') is modifiable. Look-up table 66 also outputs a '1,' indicating that Vn was almost correctly predicted, so AND gate 67 outputs a '1' as signal D, causing OR gate 68 to output a '1' as signal E.

Referring to FIG. 26, the source memory unit 29 receives signal D ('1') as a write enable signal (WE) and PATTERN [Vm] ('11110000') as input data (DI). The address controller 19 outputs the Vn address, causing '11110000' to be stored at this address, replacing the original Vn ('11010000') as source segment 15. This replacement is carried out to maintain consistency with the decoder, when segment 15 is used to predict the value of the segment below segment 15.

The code generator 22 and prediction rule controller 27 receive '1' as signal E, causing them to treat segment 15 as if it had been correctly predicted. The prediction rule controller 27 does not update PATTERN[Vm], and the code generator 22 outputs a single coded segment equal to '0,' as in the first embodiment.

Coded data output so far: '0'

Next source segment 17 is coded. The output of the bitwise exclusive-OR circuit 63 In FIG. 27 is now the following, indicating that Vn differs from PATTERN[Vm] in one bit position.

```
    11101110  (PATTERN[Vm])
XOR 11101111  (Vn)
    00000001
```

Since segment 17 is not correctly predicted, signal A is '0.' Since the bit value in Vn or '11101111' changes only twice, from '1' to '0' and then back to '1,' segment 17 is not modifiable and signal B is '0.' Signal C is '1' because only one bit is predicted incorrectly, but signal D is '0' (D=B AND C), and signal E is also '0' (E=A OR D).

In FIG. 26, the write enable signal received by the source memory unit 29 is inactive (D='0'), so segment 17 is not modified. The code generator 22 and prediction rule controller 27 receive the same signal (E='0') as in the first embodiment, causing the prediction rule controller 27 to update PATTERN[DE] and the code generator 22 to output a '1' coded segment followed by a literal segment.

Coded data output so far: '0111101111'

These coded data are identical to the coded data output by the first embodiment for FIG. 2. The decoding operation in the third embodiment is the same as in the first embodiment, so the third embodiment decodes the above data to obtain segments is and 17 in FIG. 2, instead of FIG. 25. The decoded data (FIG. 2) thus differ slightly from the original data (FIG. 25).

For comparison, the first embodiment codes segments 15 and 17 in FIG. 25 as '111010000111101111' and decodes these coded data to obtain the same segments 15 and 17 in FIG. 25. Although the decoded data are identical to the original data, the first embodiment produces eighteen coded bits, whereas the third embodiment produces only ten coded bits. The third embodiment achieves a considerable improvement in the compression ratio for these two segments.

Since the third embodiment alters the data, applications of the third embodiment are limited to bit-mapped images and other data in which alterations are permissible. For such data, the third embodiment can significantly improve the compression ratio. The condition that the altered data have been almost correctly predicted assures that the alterations will be minor, and the modification condition can be set to assure that the effects of substantially all of these minor alterations will be barely, if at all, perceptible.

Various modifications can be made to the circuit configuration shown in FIG. 27. It is not essential that signal C be inactive when Vn and PATTERN[Vm] are equal, as in that case writing PATTERN[Vm] into the source memory unit 29 will not change the value of Vn.

Fourth embodiment

The fourth embodiment combines the second and third embodiments, using coded segments of fixed length, and modifying data that are almost correctly predicted and satisfy a modification condition.

Figure 28:
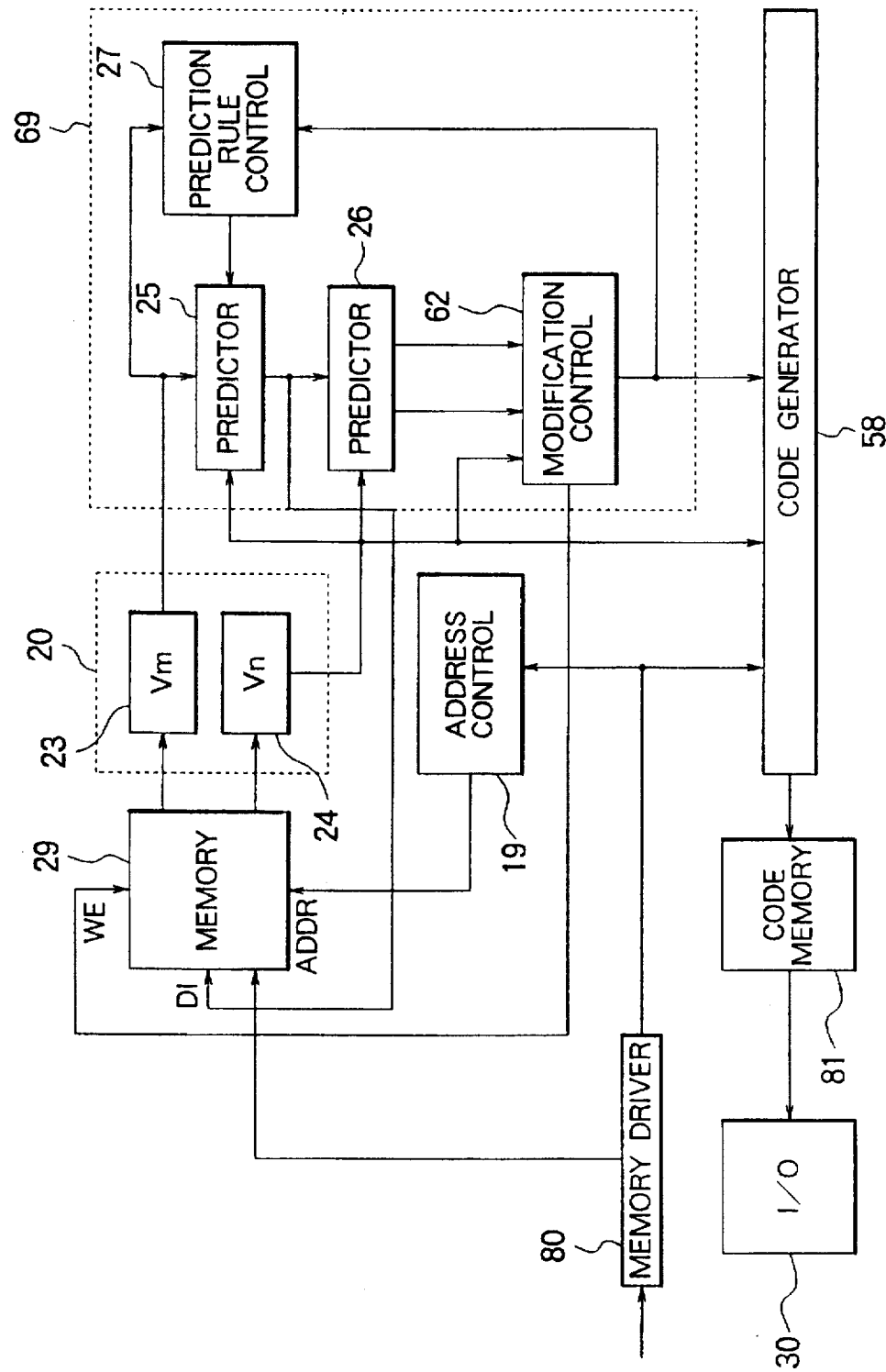
FIG. 28 is a block diagram of a fourth novel coder.

FIG. 28 shows the configuration of the coder in the fourth embodiment. The configuration is the same as in the second embodiment, shown in FIG. 18, except for the insertion of the modification controller 62 between the comparator 26 and code generator 58, and the output of predicted data and a write enable signal from the predictor 25 and modification controller 62 to the source memory unit 29. These changes are as described in the third embodiment.

The operation of the fourth embodiment can be understood from the preceding embodiments, so a detailed description will be omitted.

Further variations

Figure 29:
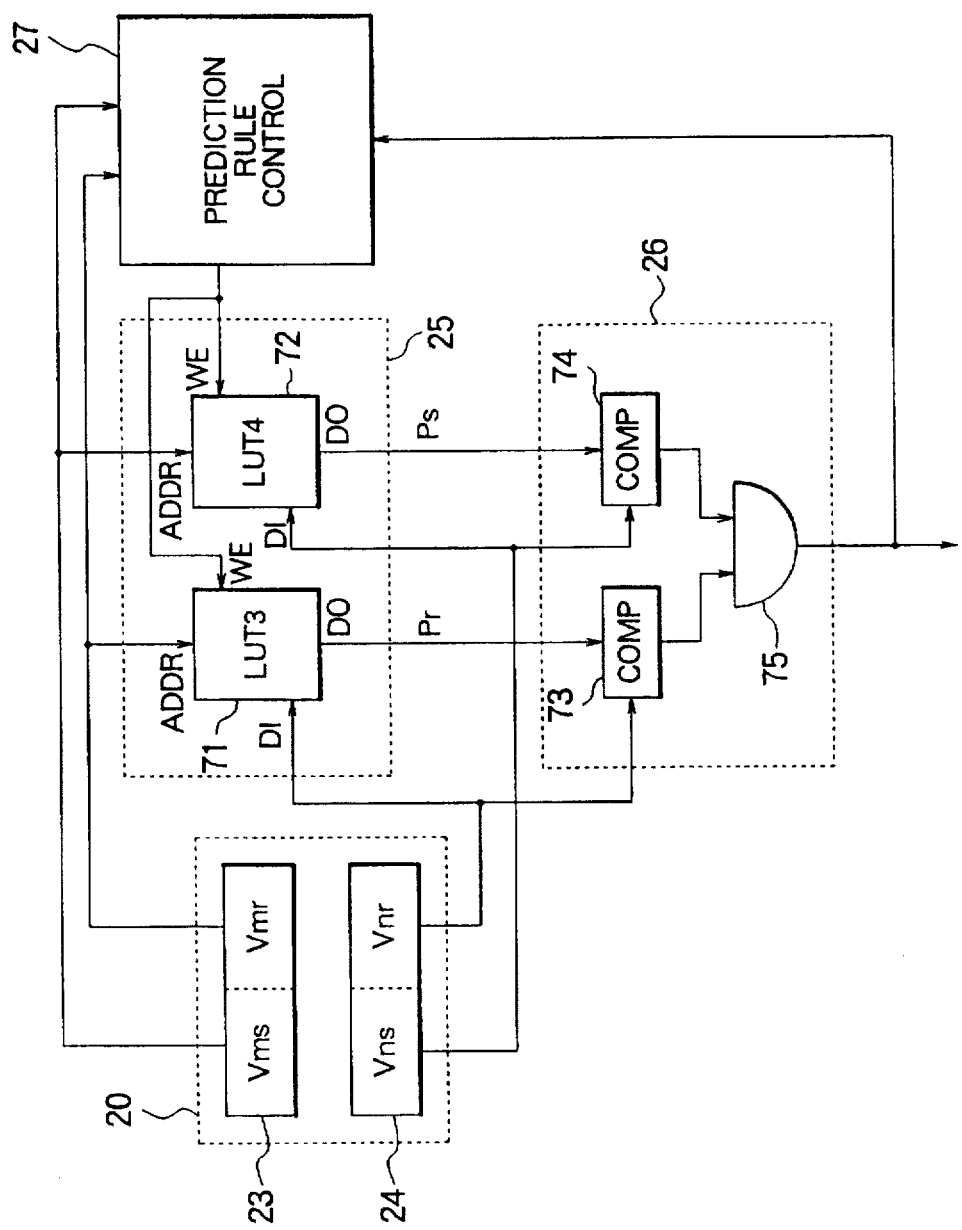
FIG. 29 is a block variation illustrating a variation of the predictor in the novel coders and decoders.

FIG. 29 shows a variation of the predictor 25 that can be employed in any of the preceding embodiments. In this variation Vm is divided into a right-hand group of bits Vmr and a left-hand group of bits Vms. Similarly, Vn is divided into right-hand and left-hand groups of bits Vnr and Vns.

This predictor 25 consists of two look-up tables 71 and 72 (LUT3 and LUT4). As address signals, look-up table 71 (LUT3) receives Vmr, and look-up table 72 (LUT4) receives Vms. As data input signals, look-up table 71 receives Vnr and look-up table 72 receives Vns. Both look-up tables 71 and 72 receive the same write-enable signal from the prediction rule controller 27.

In response to Vmr, look-up table 71 outputs a partial predicted value Pr equal in length to Vnr. In response to Vms, look-up table 72 outputs a partial predicted value Ps equal in length to Vns. The partial predicted values Pr and Ps can be concatenated to obtain the predicted value PATTERN[Vm] described in the preceding embodiments, which can be Input to a comparator 26 like, for example, the one shown in FIG. 27.

Alternatively, as shown in FIG. 29, the comparator 26 may comprise two partial comparators 73 and 74. Partial comparator 73 compares Pr with Vnr, outputting a signal that is high ('1') when Pr matches Vnr, and low ('0') when Pr differs from Vnr. Partial comparator 74 compares Ps with Vns and outputs a similar signal. An AND gate 75 takes the logical AND of the outputs of partial comparators 73 and 74, thereby producing the output of the comparator 26. This output is high ('1') when Pr matches Vnr and Ps also matches Vns, and low ('0') when either Pr or Ps (or both) fails to match. This output signal is provided to the prediction rule controller 27 and to the code generator or code interpreter (not visible).

Though structured differently, the predictor 25 in FIG. 29 operates Just as the predictors 25 in the preceding embodiments, predicting the contents of register 24 from the contents of register 23. The comparator 26 also operates in the same way, indicating whether the predicted contents of register 24 match the actual contents in all bit positions. The comparator 26 can be modified to operate as in the third embodiment and indicate whether Vn is almost correctly predicted, by making partial comparators 73 and 74 the right and left halves of bitwise exclusive-OR circuit 63 in FIG. 27.

The prediction rule controller 27 in FIG. 29 receives both Vmr and Vms and operates as in the preceding embodiments, maintaining a separate count for each combination of Vmr and Vms. When one of these counts is decremented to zero, the corresponding data in both look-up tables 71 and 72 are updated by writing Vnr in look-up table 71 and Vns in look-up table 72.

The advantage of dividing the predictor 25 into two separate look-up tables is that the combined size of these two look-up tables can be smaller than the size of a single table. If Vm and Vn are eight-bit segments, for example, then a predictor 25 structured as a single look-up table must store eight ($2^3$) bits at each of $2^8$ addresses, requiring a capacity of $2^{11}$ or two thousand forty-eight bits. Dividing Vm into groups of four bits Vmr and Vms, and Vn into corresponding groups of four bits Vnr and Vns, means that each of the two look-up tables 71 and 72 in FIG. 29 need store only sixteen four-bit values. The divided configuration requires a capacity of only sixty-four bits for each table, and a combined capacity of only one-hundred twenty-eight bits for both tables, a size reduction by a factor of sixteen.

The disadvantage of dividing the predictor 25 into separate tables is that the prediction rule cannot be adapted to provide a different value for each value of Vm, but only to provide one value for each value of Vmr and another value for each value of Vms. Prediction accuracy is therefore likely to be reduced, with a corresponding effect on the compression ratio.

Further size reductions can be achieved by dividing Vm and Vn into more than two groups of bits, and the predictor 25 into more than two tables. In general, these further reductions in table size will be achieved at the cost of a further loss of prediction accuracy and a lower compression ratio.

The random-access memory 31 in the prediction rule controller 27 can be similarly divided into two or more separate parts, which maintain separate counts for each of the constituent tables of the predictor 25. In that case, each of the tables in the predictor 25 can be updated separately. The comparator 26 should provide the prediction rule controller 27 with separate signals indicating whether the output of each table in the predictor 25 matches Vn, and provide the code generator or code interpreter with a single signal indicating whether all outputs match Vn.

The look-up tables 65 and 66 in FIG. 27 can also be modified in various ways to achieve reduced size. To detect predictions that miss by only one bit, for example, look-up table 66 can be replaced by a logic circuit.

Many modifications are possible to the circuit configurations shown in FIGS. 4 and 6. In FIG. 4, for example, control units 38 and 41 could be combined into a single control unit, and this control unit could be adapted to shift the '1' bit in register 37 back and forth to produce the value of X, instead of producing X by decoding K. In FIG. 6, register 24 could be loaded directly from the output of selector 51, instead of from output memory unit 45.

In the coder, one or the other of the two registers 23 and 24 in the buffer unit 20 can be omitted, the value of Vn or Vm being provided directly from the source memory unit 29 to the coding model circuit. In the decoder, register 24 can be replaced by direct input of Vn from the code interpreter to the predictor 25.

The predictor 25 and random-access memory 31 need not be physically distinct. With suitable address control, they can be part of a single random-access memory unit, which may also include memory unit 29 or 45, and some or all of the registers indicated in FIGS. 4 and 6. Similarly, the various adders and subtractors shown in FIGS. 4 or 6 can be combined into a single arithmetic unit, which can also increment register values.

In the first and third embodiments, CNT1 and CNT2 can be initialized and reinitialized to different values, instead of to the same value M, so that the length of the coded segments increases after a first number of consecutive coded segments designating zero literal segments, and decreases after a second number of consecutive coded segments designating one literal segment each.

The modification controller 62 in the third embodiment was described as modifying source segments in the source memory unit 29, but if this inconvenient, the buffer unit 20 can be enlarged to retain each symbol from the time the symbol is read as part of Vn until the time the symbol is referenced as part of Vm, and modifications can be made to data in the buffer unit 20, leaving the data in source memory unit 29 intact. An added benefit of this variation is that each symbol has to be read only once from source memory unit 29 into buffer unit 20.

The buffer unit 20 in the decoder can be similarly enlarged, to retain segments from the time when they are decoded until they are used for prediction (Vm), to avoid having to read Vm from the output memory unit 45.

Those skilled in the art will recognize that still further variations are possible within the scope claimed below.

What is claimed is:

1. A method of coding and decoding an input sequence of symbols, comprising the steps of:

dividing said input sequence into source segments, each source segment among said source segments consisting of n consecutive symbols, where n is a fixed integer greater than one;

deriving a predicted value for each said source segment from symbols preceding said source segment in said input sequence;

comparing each said source segment with the predicted value thus derived for said source segment and determining whether said source segment is a correctly predicted segment or an incorrectly predicted segment;

generating a coded sequence of symbols, the symbols in said coded sequence being grouped into coded segments and literal segments, said literal segments being interspersed among said coded segments, said literal segments being identical to said incorrectly predicted segments, and each coded segment among said coded segments designating a non-negative number of correctly predicted segments and a non-negative number of incorrectly predicted segments;

sending said coded sequence of symbols to an input-output device;

receiving said coded sequence of symbols from said input-output device;

decoding each coded segment received from said input-output device, thereby obtaining the non-negative number of correctly predicted segments and the non-negative number of incorrectly predicted segments designated by said coded segment;

if said non-negative number of correctly predicted segments is greater than zero, deriving a predicted value consisting of n symbols from decoded symbols received and decoded previously, repeating this step a number of times equal to said non-negative number of correctly predicted segments, and outputting the predicted values thus obtained as newly decoded symbols in a decoded sequence of symbols; and if said non-negative number of incorrectly predicted segments is greater than zero, copying a number of said literal segments equal to said non-negative number of incorrectly predicted segments from said coded sequence and outputting these literal segments as newly decoded symbols in said decoded sequence of symbols.

2. The method of claim 1, wherein said step of deriving a predicted value for each said source segment comprises:

reading, for each said source segment, m symbols at certain preceding positions relative to said source segment in said input sequence, thus obtaining a first m-symbol value, where m is a fixed integer greater than one;

using said first m-symbol value to address a first look-up table; and reading said predicted value from said first look-up table;

and wherein said step of, if said first non-negative number of correctly predicted segments is greater than zero, deriving a predicted value consisting of n symbols from decoded symbols received and decoded previously comprises:

reading m decoded symbols at certain relative preceding positions in said decoded sequence, thus obtaining a second m-symbol value, where m is a fixed integer greater than one;

using said second m-symbol value to address a second look-up table having contents to identical to said first look-up table; and reading said predicted value from said second look-up table.

3. The method of claim 2, comprising the further steps of:

maintaining, for each said first m-symbol value, a first count of source segments incorrectly predicted from said m-symbol value;

updating said first look-up table when said first count reaches a certain value;

maintaining, for each said second m-symbol value, a second count of literal segments copied to said decoded sequence in positions such that said second m-symbol value occurs at said relative preceding positions; and updating said second look-up table when said second count reaches a certain value, thereby maintaining consistency between said first look-up table and said second look-up table.

4. The method of claim 1, wherein said coded segments have a variable length, comprising the further steps of:

maintaining a third count of consecutive coded segments that designate zero incorrectly predicted segments;

maintaining a fourth count of consecutive coded segments that each designate at least one incorrectly predicted segment;

increasing the length of said coded segments when said third count reaches a certain first value; and decreasing the length of said coded segments when said fourth count reaches a certain second value.

5. The method of claim 4, wherein all of said coded segments designate at most one incorrectly predicted segment.

6. The method of claim 1, wherein said coded segments have a fixed length.

7. The method of claim 1, wherein said step of comparing source segments also identifies certain source segments which are incorrectly predicted as being almost correctly predicted segments, comprising the further steps of:

testing said almost correctly predicted segments according to a certain modification condition;

identifying certain source segments among said almost correctly predicted segments as modifiable segments, responsive to said modification condition; and modifying said modifiable segments to make each modifiable segment among said modifiable segments equal to the predicted value derived for said modifiable segment in said step of deriving a predicted value for each said source segment.

8. The method of claim 1, wherein said input sequence of symbols represents an image consisting of pixels, in which each pixel is represented by a certain number of said symbols.

9. The method of claim 8, comprising the further steps of:

transferring header information from said input sequence of symbols to said coded sequence of symbols, said header information designating the number of said symbols per pixel in said image; and transferring said header information from said coded sequence of symbols to said decoded sequence of symbols.

10. The method of claim 8, comprising the further step of placing the symbols in said input sequence so that the symbols representing each pixel in said image are disposed consecutively.

11. A method of coding an input sequence of symbols, comprising the steps of:

dividing said input sequence into source segments, each source segment among said source segments consisting of n consecutive symbols, where n is a fixed integer greater than one;

deriving a predicted value for each said source segment from symbols preceding said source segment in said input sequence;

comparing each said source segment with the predicted value thus derived for said source segment and determining whether said source segment is a correctly predicted segment or an incorrectly predicted segment; and generating a coded sequence of symbols, the symbols in said coded sequence being grouped into coded segments and literal segments, said literal segments being interspersed among said coded segments, said literal segments being identical to said incorrectly predicted segments, and each coded segment among said coded segments designating a non-negative number of correctly predicted segments and a non-negative number of incorrectly predicted segments.

12. The method of claim 11, wherein said step of deriving a predicted value comprises:

reading, for each said source segment, m symbols at certain preceding positions relative to said source segment in said input sequence, thus obtaining an m-symbol value, where m is a fixed integer greater than one;

using said m-symbol value to address a look-up table; and reading said predicted value from said look-up table.

13. The method of claim 12, comprising the further steps of:

maintaining, for each said m-symbol value, a count of source segments incorrectly predicted from said m-symbol value; and updating said look-up table when said count reaches a certain value.

14. The method of claim 11, wherein said coded segments have a variable length, comprising the further steps of:

maintaining a first count of consecutive coded segments that designate zero incorrectly predicted segments;

maintaining a second count of consecutive coded segments that each designate at least one incorrectly predicted segment;

increasing the length of said coded segments when said first count reaches a certain first value; and decreasing the length of said coded segments when said second count reaches a certain second value.

15. The method of claim 14, wherein all of said coded segments designate at most one incorrectly predicted segment.

16. The method of claim 11, wherein said coded segments have a fixed length.

17. The method of claim 11, wherein said step of comparing source segments also identifies certain source segments which are incorrectly predicted as being almost correctly predicted segments, comprising the further steps of:

testing said almost correctly predicted segments according to a certain modification condition;

identifying certain source segments among said almost correctly predicted segments as modifiable segments, responsive to said modification condition; and modifying said modifiable segments to make each modifiable segment among said modifiable segments equal to the predicted value derived for said modifiable segment in said step of deriving a predicted value for each said source segment.

18. The method of claim 11, wherein said input sequence of symbols represents an image consisting of pixels, in which each pixel is represented by a certain number of said symbols.

19. The method of claim 18, comprising the further step of transferring header information from said input sequence of symbols to said coded sequence of symbols, said header information designating the number of said symbols per pixel in said image.

20. The method of claim 18, comprising the further step of placing the symbols in said input sequence so that the symbols representing each pixel in said image are disposed consecutively.

21. A method of decoding a coded sequence of symbols to obtain a sequence of decoded symbols, where the symbols in said coded sequence are grouped into coded segments and literal segments, said literal segments consisting of n symbols each, where n is a fixed integer greater than one, comprising the steps of:

decoding one of said coded segments, thereby obtaining a first non-negative number and a second non-negative number;

if said first non-negative number is greater than zero, deriving a predicted value consisting of n symbols from decoded symbols decoded previously, repeating this step a number of times equal to said first non-negative number, and outputting the predicted values thus obtained as newly decoded symbols;

if said second non-negative number is greater than zero, copying a number of said literal segments equal to said second non-negative number from said coded sequence to said decoded sequence; and repeating the above steps for all of said coded segments.

22. The method of claim 21, wherein said step of deriving a predicted value comprises:

reading m decoded symbols at certain relative preceding positions in said decoded sequence, thus obtaining an m-symbol value, where m is a fixed integer greater than one;

using said m-symbol value to address a look-up table; and reading said predicted value from said look-up table.

23. The method of claim 22, comprising the further steps of:

maintaining, for each said m-symbol value, a count of literal segments copied to said decoded sequence in positions such that said m-symbol value occurs at said relative preceding positions; and updating said look-up table when said count reaches a certain value.

24. The method of claim 21, wherein said coded segments have a variable length, comprising the further steps of:

maintaining a first count of consecutive coded segments for which said second non-negative number is zero;

maintaining a second count of consecutive coded segments for which said second non-negative number is not zero;

assigning an increased length to said coded segments when said first count reaches a certain first value; and assigning a decreased length to said coded segments when said second count reaches a certain second value.

25. The method of claim 21, wherein said coded segments have a fixed length.

26. The method of claim 21, wherein said decoded sequence of symbols represents an image consisting of pixels, in which each pixel is represented by a certain number of said symbols.

27. The method of claim 26, comprising the further step of transferring header information from said coded sequence of symbols to said decoded sequence of symbols, said header information designating the number of said symbols per pixel in said image.

28. The method of claim 26, wherein the symbols representing each pixel in said image occur consecutively in said decoded sequence of symbols.

29. A system having a coder for coding an input sequence of symbols to generate a coded sequence of symbols, and a decoder for decoding the coded sequence of symbols to obtain a sequence of decoded symbols, wherein:

said coder comprises a first memory unit for storing said input sequence of symbols, said symbols being grouped into source segments consisting of n consecutive symbols each, where n is an integer greater than one;

a second memory unit coupled to said first memory unit, for storing m symbols, where m is an integer greater than one;

a third memory unit coupled to said first memory unit, for storing an arbitrary source segment among said source segments;

a first address controller coupled to said first memory unit, for successively reading said source segments from said first memory unit into said third memory unit, and for each source segment thus read, reading m symbols from said first memory unit, at certain preceding positions relative to said source segment, into said second memory unit;

a first predictor coupled to said second memory unit, for deriving a first predicted value from the m symbols in said second memory unit;

a comparator coupled to said first predictor, for comparing said first predicted value with the source segment in said third memory unit and determining whether said source segment is correctly predicted or incorrectly predicted; and a code generator coupled to said comparator, for counting correctly predicted segments and incorrectly predicted segments as determined by said comparator, generating coded segments, and placing said coded segments and said incorrectly predicted segments in said coded sequence, where each coded segment among said coded segments consists of at least one symbol and designates a non-negative number of correctly predicted segments and a non-negative number of incorrectly predicted segments, and said decoder comprises:

a fourth memory unit for storing said sequence of decoded symbols;

a fifth memory unit coupled to said fourth memory unit, for storing m symbols, where m is said integer greater than one;

a second address controller coupled to said fourth memory unit, for reading m symbols at designated positions from said fourth memory unit into said fifth memory unit;

a second predictor coupled to said fifth memory unit, for deriving a second predicted value from the m symbols in said fifth memory unit; and a code interpreter coupled to said second predictor, for decoding each one of said coded segments in said coded sequence, thereby obtaining for each one of said coded segments a first non-negative number and a second non-negative number, storing in said fourth memory unit a quantity, equal in number to said first non-negative number, of second predicted values obtained by said predictor, and copying a quantity, equal in number to said second non-negative number, of said incorrectly predicted segments from said coded sequence to said fourth memory unit.

30. The system of claim 29, wherein:

said first predictor comprises a first table having addresses and storing a first predicted value at each of said addresses, for receiving the m symbols in said second memory unit, and outputting the first predicted value stored at an address designated by said m symbols in said second memory unit; and said second predictor comprises a second table having addresses and storing a second predicted value at each of said addresses, for receiving the m symbols in said fifth memory unit, and outputting the second predicted value stored at an address designated by said m symbols in said fifth memory unit, the second predicted value stored at each address in said second table being identical to the first predicted value stored at an identical address in said first table.

31. The system of claim 30, also comprising:

a first prediction rule controller disposed in said coder, for updating said first table at a certain address when the first predicted value stored at said certain address is determined by said comparator to have incorrectly predicted a certain number of source segments; and a second prediction rule controller disposed in said decoder, for updating said second table responsive to the incorrectly predicted segments in said coded sequence, to maintain consistency between said first table and said second table.

32. The system of claim 30, wherein:

said first table is divided into at least two parts, which are addressed separately by corresponding groups of symbols among the m symbols in said second memory unit, and which output separate partial first predicted values that are combined to form said first predicted value; and said second table is divided into at least two parts, which are addressed separately by corresponding groups of symbols among the m symbols in said fifth memory unit, and which output separate partial second predicted values that are combined to form said second predicted value.

33. The system of claim 29, wherein said coded segments have a variable length, also comprising:

a first length controller disposed in said coder, for maintaining a first count of consecutive coded segments designating zero incorrectly predicted segments, maintaining a second count of consecutive coded segments designating at least one incorrectly predicted segment, increasing the length of said coded segments when said first count reaches a certain first value, and decreasing the length of said coded segments when said second count reaches a certain second value; and a second length controller disposed in said decoder, for maintaining a third count of consecutive coded segments designating zero incorrectly predicted segments, maintaining a fourth count of consecutive coded segments each designating at least one incorrectly predicted segment, assigning an increased length to said coded segments when said third count reaches said first value, and assigning a decreased length to said coded segments when said fourth count reaches said second value.

34. The system of claim 33, wherein all of said coded segments designate at most one incorrectly predicted segment.

35. The system of claim 29, wherein said coded segments have a fixed length.

36. The system of claim 29, wherein said comparator identifies certain source segments which are incorrectly predicted as being almost correctly predicted segments, also comprising:

a modification controller for testing said almost correctly predicted segments according to a certain modification condition, identifying certain source segments among said almost correctly predicted segments as modifiable segments, responsive to said modification condition, and modifying each modifiable segment among said modifiable segments to make said modifiable segment equal to the predicted value derived for said modifiable segment by said first predictor.

37. The system of claim 29, further comprising:

a first memory driver coupled to said first memory unit, for receiving said input sequence of symbols and header information, storing said input sequence of symbols in said first memory unit, and transferring at least part of said header information to said first address controller and said code generator;

wherein said code generator places the header information received from said first memory driver at a beginning of said coded sequence of symbols.

38. The system of claim 37, wherein said input sequence of symbols represents an image consisting of pixels, in which each pixel is represented by a certain number of said symbols, said certain number of said symbols being designated in the header information transferred to said code generator, and being reported by said first memory driver to said first address controller.

39. The system of claim 37, in which said first memory driver stores the symbols representing each pixel in said image at consecutive locations in said first memory unit.

40. The system of claim 37, further comprising:
a second memory driver coupled to said code interpreter and said fourth memory unit, for receiving from said code interpreter the header information disposed at the beginning of said coded sequence of symbols, reading said decoded sequence of symbols from said fourth memory unit, and outputting said header information disposed at the beginning of said coded sequence of symbols, followed by the decoded sequence of symbols read from said fourth memory unit;
and wherein said code interpreter notifies said second address controller of said certain number of said symbols.

41. A coder for coding an input sequence of symbols to generate a coded sequence of symbols, comprising:
a first memory unit for storing said input sequence of symbols, said symbols being grouped into source segments consisting of n consecutive symbols each, where n is an integer greater than one;
a second memory unit coupled to said first memory unit, for storing m symbols, where m is an integer greater than one;
a third memory unit coupled to said first memory unit, for storing an arbitrary source segment among said source segments;
an address controller coupled to said first memory unit, for successively reading said source segments from said first memory unit into said third memory unit, and for each source segment thus read, reading m symbols from said first memory unit, at certain preceding positions relative to said source segment, into said second memory unit;
a predictor coupled to said second memory unit, for deriving a predicted value from the m symbols in said second memory unit;
a comparator coupled to said predictor, for comparing said predicted value with the source segment in said third memory unit and determining whether said source segment is correctly predicted or incorrectly predicted; and
a code generator coupled to said comparator, for counting correctly predicted segments and incorrectly predicted segments as determined by said comparator, generating coded segments, and placing said coded segments and said incorrectly predicted segments in said coded sequence, where each coded segment among said coded segments consists of at least one symbol and designates a non-negative number of correctly predicted segments and a non-negative number of incorrectly predicted segments.

42. The coder of claim 41, wherein said predictor comprises a table having addresses and storing a predicted value at each of said addresses, for receiving the m symbols in said second memory unit, and outputting the predicted value stored at an address designated by said m symbols.

43. The coder of claim 42, also comprising a prediction rule controller for updating said table at a certain address when the predicted value stored at said address is determined by said comparator to have incorrectly predicted a certain number of source segments.

44. The coder of claim 42, wherein said table is divided into at least two parts, which are addressed separately by corresponding groups of symbols among the m symbols in said second memory unit, and which output separate partial predicted values that are combined to form said predicted value.

45. The coder of claim 41, wherein said coded segments have a variable length, also comprising a length controller for maintaining a first count of consecutive coded segments designating zero incorrectly predicted segments, maintaining a second count of consecutive coded segments designating at least one incorrectly predicted segment, increasing the length of said coded segments when said first count reaches a certain first value, and decreasing the length of said coded segments when said second count reaches a certain second value.

46. The coder of claim 45, wherein all of said coded segments designate at most one incorrectly predicted segment.

47. The coder of claim 41, wherein said coded segments have a fixed length.

48. The coder of claim 41, wherein said comparator identifies certain source segments which are incorrectly predicted as being almost correctly predicted segments, also comprising:
a modification controller for testing said almost correctly predicted segments according to a certain modification condition, identifying certain source segments among said almost correctly predicted segments as modifiable source segments, responsive to said modification condition, and modifying each modifiable source segment among said modifiable source segments to make said modifiable source segment equal to the predicted value derived for said modifiable source segment by said predictor.

49. The coder of claim 41, further comprising:
a memory driver coupled to said first memory unit, for receiving said input sequence of symbols and header information, storing said input sequence of symbols in said first memory unit, and transferring at least part of said header information to said address controller and said code generator;
wherein said code generator places the header information received from said memory driver at a beginning of said coded sequence of symbols.

50. The coder of claim 49, wherein said input sequence of symbols represents an image consisting of pixels, in which each pixel is represented by a certain number of said symbols, said certain number of said symbols being designated in said header information and reported by said memory driver to said first address controller.

51. The coder of claim 50, in which said memory driver stores the symbols representing each pixel in said image at consecutive locations in said first memory unit.

52. A decoder for decoding a coded sequence of symbols to obtain a sequence of decoded symbols, where the symbols in said coded sequence are grouped into coded segments and literal segments, comprising:
a first memory unit for storing said sequence of decoded symbols;
a second memory unit coupled to said first memory unit, for storing m symbols, where m is an integer greater than one;
an address controller coupled to said first memory unit, for reading m symbols at designated positions from said first memory unit into said second memory unit;
a predictor coupled to said second memory unit, for deriving a predicted value from the m symbols in said second memory unit; and a code interpreter coupled to said predictor, for decoding each one of said coded segments, thereby obtaining for each one of said coded segments a first non-negative number and a second non-negative number, storing in said first memory unit a quantity, equal in number to said first non-negative number, of predicted values obtained by said predictor, and copying a quantity, equal in number to said second non-negative number, of said literal segments from said coded sequence to said first memory unit.

53. The decoder of claim 52, wherein said predictor comprises a table having addresses and storing a predicted value at each of said addresses, for receiving the m symbols in said second memory unit, and outputting the predicted value stored at a corresponding address.

54. The decoder of claim 53, also comprising a prediction rule controller for updating said table at an address corresponding to a certain m-symbol value when a certain number of literal segments have been copied to said decoded sequence in positions such that said m-symbol value occurs at said relative preceding positions.

55. The decoder of claim 54, wherein said table is divided into at least two parts, which are addressed separately by corresponding groups of symbols among the m symbols in said second memory unit, and which output separate partial predicted values that are combined to form said predicted value.

56. The decoder of claim 52, wherein said coded segments have a variable length, also comprising a length controller for maintaining a first count of consecutive coded segments designating zero incorrectly predicted segments, maintaining a second count of consecutive coded segments each designating at least one incorrectly predicted segment, assigning an increased length to said coded segments when said first count reaches a certain first value, and assigning a decreased length to said coded segments when said second count reaches a certain second value.

57. The decoder of claim 52, wherein said coded segments have a fixed length.

58. The decoder of claim 52, further comprising:

a memory driver coupled to said code interpreter and said first memory unit, for receiving from said code interpreter header information disposed at a beginning of said coded sequence of symbols, reading said decoded sequence of symbols from said first memory unit, and outputting said header information followed by said decoded sequence of symbols.

59. The decoder of claim 58, wherein:

said decoded sequence of symbols represents an image consisting of pixels, in which each pixel is represented by a certain number of said symbols, said certain number of said symbols being designated in said header information; and said code interpreter notifies said address controller of the number of said symbols per pixel.

60. The decoder of claim 59, wherein the symbols representing each pixel in said image occur consecutively in said decoded sequence of symbols.

* * * * *